(12) United States Patent
Yang et al.

(10) Patent No.: US 12,167,540 B2
(45) Date of Patent: Dec. 10, 2024

(54) PRINTED CIRCUIT BOARD

(71) Applicant: LG INNOTEK CO., LTD., Seoul (KR)

(72) Inventors: Eui Yeol Yang, Seoul (KR); Se Woong Na, Seoul (KR); Do Hyuk Yoo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 378 days.

(21) Appl. No.: 17/641,865

(22) PCT Filed: Sep. 9, 2020

(86) PCT No.: PCT/KR2020/012137
§ 371 (c)(1),
(2) Date: Mar. 10, 2022

(87) PCT Pub. No.: WO2021/049859
PCT Pub. Date: Mar. 18, 2021

(65) Prior Publication Data
US 2022/0346236 A1 Oct. 27, 2022

(30) Foreign Application Priority Data

Sep. 10, 2019 (KR) .................. 10-2019-0112233

(51) Int. Cl.
*H05K 1/03* (2006.01)
*H05K 3/06* (2006.01)
(Continued)

(52) U.S. Cl.
CPC ........... *H05K 3/107* (2013.01); *H05K 1/0306* (2013.01); *H05K 1/0373* (2013.01); *H05K 3/06* (2013.01);
(Continued)

(58) Field of Classification Search
CPC ............... H05K 1/0306; H05K 1/0373; H05K 2201/09036; H05K 2203/1377
See application file for complete search history.

(56) References Cited

U.S. PATENT DOCUMENTS 9,253,897 B2 2/2016 Kaneko et al.
9,265,161 B2 2/2016 Ahn et al.
(Continued)

FOREIGN PATENT DOCUMENTS

| CN | 101640977 | 2/2010 |
|---|---|---|
| JP | 7-176866 | 7/1995 |

(Continued)

OTHER PUBLICATIONS

International Search Report dated Dec. 24, 2020 issued in Application No. PCT/KR2020/012137.
(Continued)

*Primary Examiner* — Sherman Ng
(74) *Attorney, Agent, or Firm* — KED & ASSOCIATES

(57) ABSTRACT

A printed circuit board according to an embodiment includes a first insulating layer; a first circuit pattern disposed on a lower surface or inside the first insulating layer; a second circuit pattern disposed on an upper surface of the first insulating layer; a second insulating layer disposed on the upper surface of the first insulating layer and surrounding the second circuit pattern; and a protective layer disposed on an upper surface of the second insulating layer, wherein the second insulating layer has at least one recess formed on its upper surface, and wherein the protective layer is disposed in the recess formed on the upper surface of the second insulating layer.

17 Claims, 19 Drawing Sheets

(51) Int. Cl.
*H05K 3/10* (2006.01)
*H05K 3/20* (2006.01)
*H05K 3/28* (2006.01)

(52) U.S. Cl.
CPC ............... *H05K 3/20* (2013.01); *H05K 3/28* (2013.01); *H05K 2201/09036* (2013.01); *H05K 2203/1377* (2013.01)

(56) References Cited

U.S. PATENT DOCUMENTS

| | | |
|---|---|---|
| 9,406,599 B2 | 8/2016 | Suzuki |
| 9,585,258 B2 | 2/2017 | Seo et al. |
| 2010/0028623 A1 | 2/2010 | Ito et al. |
| 2012/0055698 A1 | 3/2012 | Won et al. |
| 2014/0041902 A1* | 2/2014 | Lee ................ G03F 7/2022 174/251 |
| 2015/0177621 A1 | 6/2015 | Lee et al. |
| 2016/0044788 A1* | 2/2016 | Park ................ H05K 1/185 174/251 |
| 2016/0064319 A1 | 3/2016 | Suzuki |

FOREIGN PATENT DOCUMENTS

| | | |
|---|---|---|
| JP | 2003-101227 | 4/2003 |
| JP | 2007-123471 | 5/2007 |
| JP | 2014-36220 | 2/2014 |
| JP | 2015-035588 | 2/2015 |
| JP | 2016-051803 | 4/2016 |
| KR | 10-2006-0045206 | 5/2006 |
| KR | 10-2011-0060325 | 6/2011 |
| KR | 10-2012-0025311 | 3/2012 |
| KR | 10-2013-0068659 | 6/2013 |
| KR | 10-2014-0090961 | 7/2014 |
| KR | 10-2017-0122500 | 11/2017 |

OTHER PUBLICATIONS

Chinese Office Action issued in Application No. 202080063904.2 dated Jun. 29, 2023.
Korean Office Action dated Jul. 18, 2024 issued in Application No. 10-2019-0112233.
Japanese Office Action dated Oct. 1, 2024 issued in Application No. 2022-515778.

* cited by examiner (a)

(b)

(a)

(b)

(a)

(b)

(a)

(b)

(a)

(b)

PRINTED CIRCUIT BOARD

CROSS-REFERENCE TO RELATED PATENT APPLICATIONS

This application is a U.S. National Stage Application under 35 U.S.C. § 371 of PCT Application No. PCT/KR2020/012137, filed Sep. 9, 2020, which claims priority to Korean Patent Application No. 10-2019-0112233, filed Sep. 10, 2019, whose entire disclosures are hereby incorporated by reference.

TECHNICAL FIELD

An embodiment relates to a printed circuit board, and more particularly, to a printed circuit board on which a supporting insulating layer for supporting a circuit pattern disposed on an outermost layer is disposed, and a method of manufacturing the same.

BACKGROUND ART

As the miniaturization, weight reduction, and integration of electronic components accelerate, the line width of circuits is becoming smaller. In particular, as design rules of semiconductor chips are integrated on a nanometer scale, a circuit line width of a package substrate or a printed circuit board on which a semiconductor chip is mounted is reduced to several micrometers or less.

In order to increase the degree of circuit integration of the printed circuit board, that is, various methods have been proposed in order to miniaturize the circuit line width. In order to prevent loss of circuit line width in the etching step to form a pattern after copper plating, a semi-additive process (SAP) method and a modified semi-additive process (MSAP) have been proposed.

Thereafter, an Embedded Trace Substrate (hereinafter referred to as 'ETS') method in which copper foil is buried in an insulating layer to implement a finer circuit pattern has been used in the art. The ETS method is manufactured by embedding the copper foil circuit in the insulating layer instead of forming it on the surface of the insulating layer. For this reason, there is no circuit loss due to etching, so it is advantageous to refine the circuit pitch.

Meanwhile, recently, efforts are being made to develop an improved 5th generation (5G) communication system or a pre-5G communication system in order to meet the demand for wireless data traffic. Here, the 5G communication system uses ultra-high frequency (mmWave) bands (sub 6 gigabytes (6 GHz), 28 gigabytes 28 GHz, 38 gigabytes 38 GHz or higher frequencies) to achieve high data rates.

And, in order to alleviate the path loss of radio waves in the very high frequency band and increase the propagation distance of radio waves, aggregation technologies such as beamforming, massive MIMO, and array antenna are being developed in the 5G communication system. Considering that these frequency bands can consist of hundreds of active antennas of wavelengths, the antenna system becomes relatively large.

Since these antennas and AP modules are patterned or mounted on a printed circuit board, low loss of the printed circuit board is very important. This means that several substrates constituting the active antenna system, ie, an antenna substrate, an antenna feeding substrate, a transceiver substrate, and a baseband substrate, must be integrated into one compact unit.

And, the printed circuit board applied to the 5G communication system as described above is manufactured in the trend of light, thin and compact, accordingly, the circuit pattern is becoming more and more fine.

However, the conventional printed circuit board including a fine circuit pattern has a structure in which the outermost circuit pattern protrudes above the insulating layer, and accordingly, there is a problem in that the outermost circuit pattern easily collapses.

DISCLOSURE

Technical Problem

The embodiment provides a printed circuit board having a novel structure and a method of manufacturing the same.

In addition, the embodiment provides a printed circuit board capable of improving reliability by providing a structure in which a support insulating layer capable of supporting a circuit pattern disposed at the outermost portion is disposed, and a method of manufacturing the same.

In addition, the embodiment provides a printed circuit board capable of solving a reliability problem that may be caused by the filler by removing the filler exposed through the surface of the support insulating layer, and a method of manufacturing the same.

The technical problem to be solved in the embodiment is not limited to the technical problem mentioned above, and another technical problem not mentioned will be clearly understood by those of ordinary skill in the art to which the present invention belongs from the following description.

Technical Solution

The printed circuit board according to the embodiment includes a first insulating layer; a first circuit pattern disposed on a lower surface or inside the first insulating layer; a second circuit pattern disposed on an upper surface of the first insulating layer; a second insulating layer disposed on the upper surface of the first insulating layer and surrounding the second circuit pattern; and a protective layer disposed on an upper surface of the second insulating layer, wherein the second insulating layer has at least one recess formed on its upper surface, and wherein the protective layer is disposed in the recess formed on the upper surface of the second insulating layer.

In addition, the second insulating layer includes an inorganic filler, and the recess is a removal region of the inorganic filler exposed on the upper surface of the second insulating layer.

In addition, the second circuit pattern is an outermost circuit pattern, wherein the second circuit pattern and the second insulating layer is disposed to protrude on the upper surface of the first insulating layer, and wherein a height of the second circuit pattern is different from a height of the second insulating layer.

In addition, a lower surface of the second circuit pattern is positioned on the same plane as a lower surface of the second insulating layer.

In addition, an upper surface of the second circuit pattern is positioned higher than an upper surface of the second insulating layer.

In addition, the height of the second insulating layer is in the range of 20% to 99% of the height of the second circuit pattern.

In addition, the second circuit pattern includes: a first portion disposed on the upper surface of the first insulating layer and having a side surface in contact with the second insulating layer; and a second portion disposed on the first portion and protruding on the upper surface of the second insulating layer, and wherein the second portion has a portion where an upper width is less than a lower width.

In addition, a lower surface of the protective layer is positioned between an upper surface and a lower surface of the second circuit pattern, and wherein an upper surface of the protective layer is positioned higher than the upper surface of the second circuit pattern.

On the other hand, the printed circuit board according to the embodiment includes a first insulating layer; a first circuit pattern disposed inside or on a lower surface of the first insulating layer; a second circuit pattern disposed on an upper surface of the first insulating layer; and a second insulating layer disposed on the upper surface of the first insulating layer, surrounding the second circuit pattern, and having at least one recess formed thereon; wherein the second circuit pattern is an outermost circuit pattern, wherein the second insulating layer includes a resin and an inorganic filler disposed in the resin, and wherein the recess is a region in which the inorganic filler exposed through the upper surface of the second insulating layer is removed.

In addition, the second circuit pattern and the second insulating layer are disposed to protrude on the upper surface of the first insulating layer; and wherein a height of the second circuit pattern is higher than a height of the second insulating layer.

In addition, the height of the second insulating layer is in the range of 20% to 99% of the height of the second circuit pattern.

In addition, the second circuit pattern includes a first portion disposed on the upper surface of the first insulating layer and having a side surface in contact with the second insulating layer; and a second portion disposed on the first portion and protruding on the upper surface of the second insulating layer, and wherein the second portion has a portion having an upper width smaller than a lower width.

In addition, the second circuit pattern is a fine pattern, wherein a width of the second circuit pattern has a range of 6 μm to 15 μm, and wherein a space between the second circuit patterns is in the range of 8 μm to 15 μm.

On the other hand, the manufacturing method of the printed circuit board according to the embodiment includes: preparing a circuit board including a first insulating layer, a first circuit pattern buried under the first insulating layer, and a second circuit pattern disposed on an upper surface of the first insulating layer and protruding on the upper surface of the first insulating layer; disposing a second insulating layer on an upper surface of the first insulating layer and an upper surface of the second circuit pattern; removing a portion of the second insulating layer to expose an upper surface of the second circuit pattern; and removing an inorganic filler exposed on a surface of the second insulating layer and a surface of the second circuit pattern according to the removal of the second insulating layer; wherein the second insulating layer includes a resin and an inorganic filler disposed in the resin, wherein the removing of the inorganic filler includes removing the inorganic filler exposed on the surface of the second insulating layer to form a recess on the surface of the second insulating layer.

In addition, the removing of the portion of the second insulating layer is performed so that a height of the second insulating layer is in the range of 20% to 99% of a height of the second circuit pattern.

In addition, the second circuit pattern includes: a first portion disposed on the upper surface of the first insulating layer and having a side surface in contact with the second insulating layer; and a second portion disposed on the first portion and protruding on the upper surface of the second insulating layer, and wherein the second portion has a portion where an upper width is less than a lower width.

In addition, the manufacturing method of the printed circuit board according to the embodiment further includes disposing a protective layer having an opening exposing the surface of the second circuit pattern on the second insulating layer, and wherein the protective layer is disposed to fill the recess formed in the second insulating layer.

Advantageous Effects

According to an embodiment according to the present invention, in the second circuit pattern disposed on the first insulating layer and protruding on a surface of the first insulating layer, a second insulating layer supporting a side of the second circuit pattern is formed on the first insulating layer. According to this, it is possible to solve problems such as collapsing or rubbing of the protruding second circuit pattern by miniaturization of the second circuit pattern, and accordingly, product reliability may be improved.

In addition, according to an embodiment of the present invention, in forming the second insulating layer, the upper surface of the second insulating layer is positioned lower than the upper surface of the second circuit pattern. That is, in the embodiment, the height of the second insulating layer is lower than the height of the second circuit pattern. Accordingly, it is possible to solve the problem that the exposed area of the surface of the second circuit pattern is reduced by the second insulating layer remaining on the surface of the second circuit pattern, and accordingly, it is possible to solve the problem of reducing the component mounting area.

Further, in the embodiment, after forming the second insulating layer, the second insulating layer is etched so that the upper surface of the second insulating layer is positioned lower than the upper surface of the second circuit pattern. In this case, the inorganic filler is present in the second insulating layer. In addition, the inorganic filler may protrude from the surface of the second insulating layer in the final product by etching the second insulating layer. According to this, the surface area of the second insulating layer or the surface roughness of the second insulating layer can be increased by the protrusion of the inorganic filler, and accordingly, adhesion to a protective layer such as a solder resist disposed on the second insulating layer may be improved.

In addition, in the embodiment, the inorganic filler remaining on the second insulating layer or the second circuit pattern is removed, and a protective layer is disposed on the second insulating layer from which the inorganic filler is removed. According to this, it is possible to solve the problem that a short circuit occurs between the plurality of second circuit patterns as the inorganic filler remains on the second insulating layer, and accordingly, product reliability may be improved.

In addition, the printed circuit board in the embodiment is applicable to the 5G communication system, and accordingly, it is possible to further improve reliability by minimizing transmission loss at high frequencies. Specifically, the printed circuit board in the embodiment can be used at a high frequency and can reduce propagation loss.

MODES OF THE INVENTION

Figure 1A:
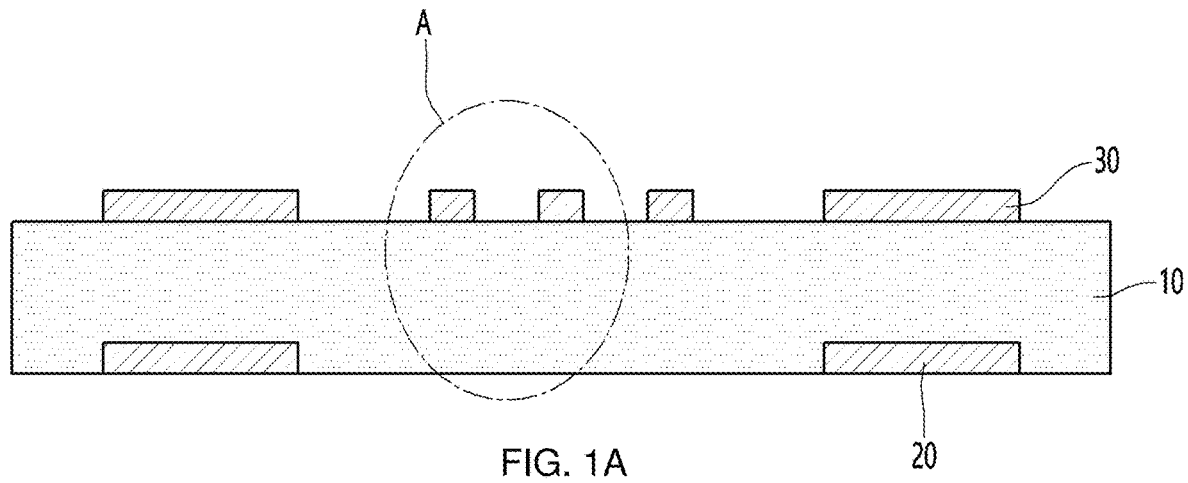
FIGS. 1A and 1B are views showing a printed circuit board according to a comparative example.

Hereinafter, embodiments disclosed in the present specification will be described in detail with reference to the accompanying drawings, but identical or similar elements are denoted by the same reference numerals regardless of reference numerals, and redundant descriptions thereof will be omitted. The suffixes "module" and "portion" for the components used in the following description are given or used interchangeably in consideration of only the ease of writing the specification, and do not have meanings or roles that are distinguished from each other by themselves. In addition, in describing the embodiments disclosed in the present specification, if it is determined that a detailed description of related known technologies may obscure the subject matter of the embodiments disclosed in the present specification, the detailed description thereof will be omitted. In addition, the accompanying drawings are only for making it easier to understand the embodiments disclosed in the present specification, and the technical idea disclosed in the present specification is not limited by the accompanying drawings, and this should be understood to include all changes, equivalents, or substitutes included in the spirit and scope of the present invention.

Terms including ordinal numbers such as first and second may be used to describe various elements, but the elements are not limited by the terms. The above terms are used only for the purpose of distinguishing one component from another component.

When a component is referred to as being "contacted" or "connected" to another component, it may be directly connected or connected to the other component, but other components may exist in the middle. On the other hand, when a component is referred to as being "directly contacted" or "directly connected" to another component, it should be understood that there is no other component in the middle.

Singular expressions include plural expressions unless the context clearly indicates otherwise.

In the present application, terms such as "comprises" or "have" are intended to designate the presence of features, numbers, steps, actions, components, parts, or combinations thereof described in the specification, but one or more other features. It is to be understood that the presence or addition of elements or numbers, steps, actions, components, parts, or combinations thereof, does not preclude in advance the possibility of being excluded.

Hereinafter, exemplary embodiments of the present invention will be described in detail with reference to the accompanying drawings.

Figure 1B:
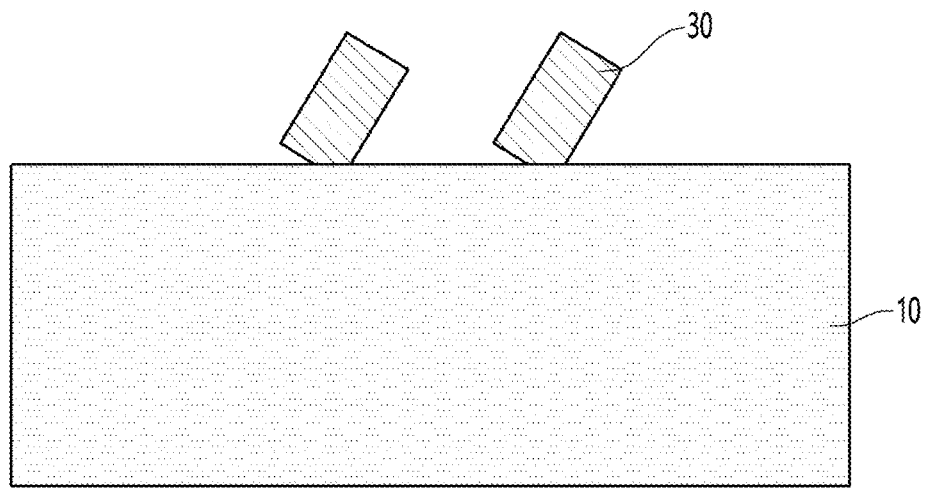

FIG. 1 is a view showing a printed circuit board according to a comparative example.

Referring to FIG. 1, as in (a), the printed circuit board according to the comparative example includes a circuit pattern manufactured by the ETS method.

Specifically, the printed circuit board manufactured by the ETS method includes an insulating layer 10, a first circuit pattern 20, and a second circuit pattern 30.

The first circuit pattern 20 is buried in the insulating layer 10.

Preferably, the first circuit pattern 20 is buried in a lower region of the insulating layer 10. Accordingly, a surface of the first circuit pattern 20 is disposed on the same plane as a lower surface of the insulating layer 10.

The second circuit pattern 30 is disposed on an upper surface of the insulating layer 10.

The second circuit pattern 30 has a structure protruding on the upper surface of the insulating layer 10.

Meanwhile, although a printed circuit board including only one insulating layer 10 and having a two-layer structure based on the circuit pattern layer is illustrated in the drawing, the number of layers of the circuit pattern of the printed circuit board may be further increased.

However, even if the number of layers of the circuit pattern increases, the second circuit pattern 30 disposed at an outermost has a structure that protrudes on the surface of the insulating layer 10.

Meanwhile, in recent years, circuit patterns have been gradually refined. And, in the case of a fine circuit pattern having a width/space of 15 μm/15 μm or less, the outermost layer must be implemented by the ETS method. That is, in the case of a fine circuit pattern in which the circuit pattern of the outermost layer has a width of 15 μm and the space between each circuit pattern is 15 μm or less, it is possible to form a stable fine circuit pattern only when the circuit pattern is formed by using the ETS method.

As in the comparative example, the outermost circuit pattern disposed at the outermost layer has a structure protruding on the upper surface of the insulating layer 10. In this case, the protruding second circuit pattern 30 may have a width of 15 μm or less. Here, when the protruding second circuit pattern 30 has a width exceeding 15 μm, it may be strong against external impact.

However, as shown in (b) of FIG. 1, the width of the second circuit pattern 30 of the outermost layer is decreasing as the circuit pattern is gradually refined, accordingly, when the second circuit pattern 30 has a structure protruding on the upper surface of the insulating layer 10, the second circuit pattern 30 easily collapses due to an external impact.

That is, as in the comparative example, the second circuit pattern 30 of the outermost layer has an extremely fine pattern shape, and accordingly, a problem of easily collapsing or being swept by a small external impact occurs.

In addition, as 5G technology develops in recent years, interest in printed circuit boards that can reflect this is increasing. At this time, in order for 5G technology to be applied, the printed circuit board must have a high multi-layer structure, and accordingly, the circuit pattern should be miniaturized. However, in the comparative example, it is possible to form a fine pattern, but there is a problem in that it cannot be stably protected.

Accordingly, the embodiment is to provide a printed circuit board of a new structure capable of solving the reliability problem of the outermost fine pattern and a control method thereof.

Figure 2:
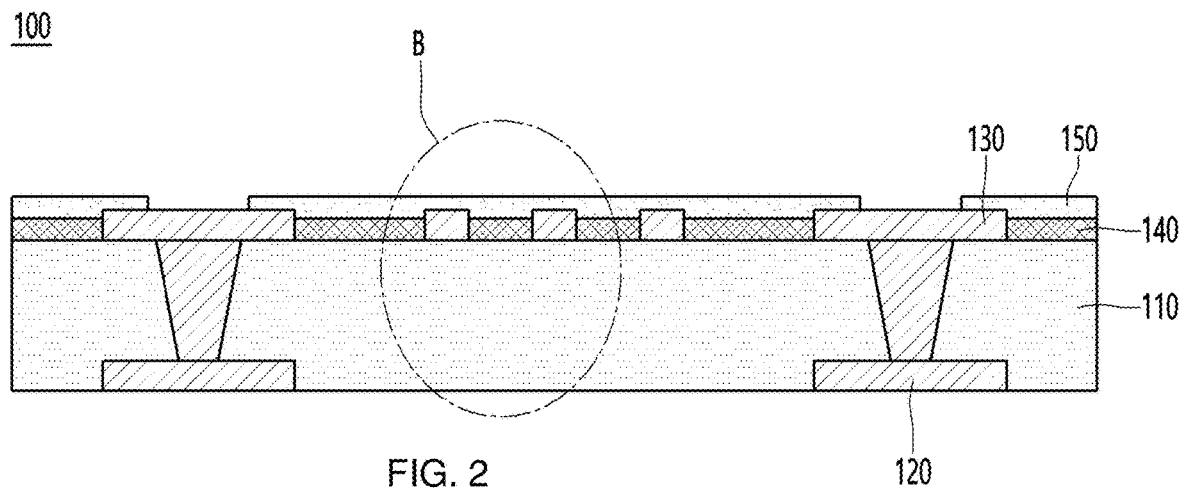
FIG. 2 is a view showing a printed circuit board according to an embodiment.
Figure 3:
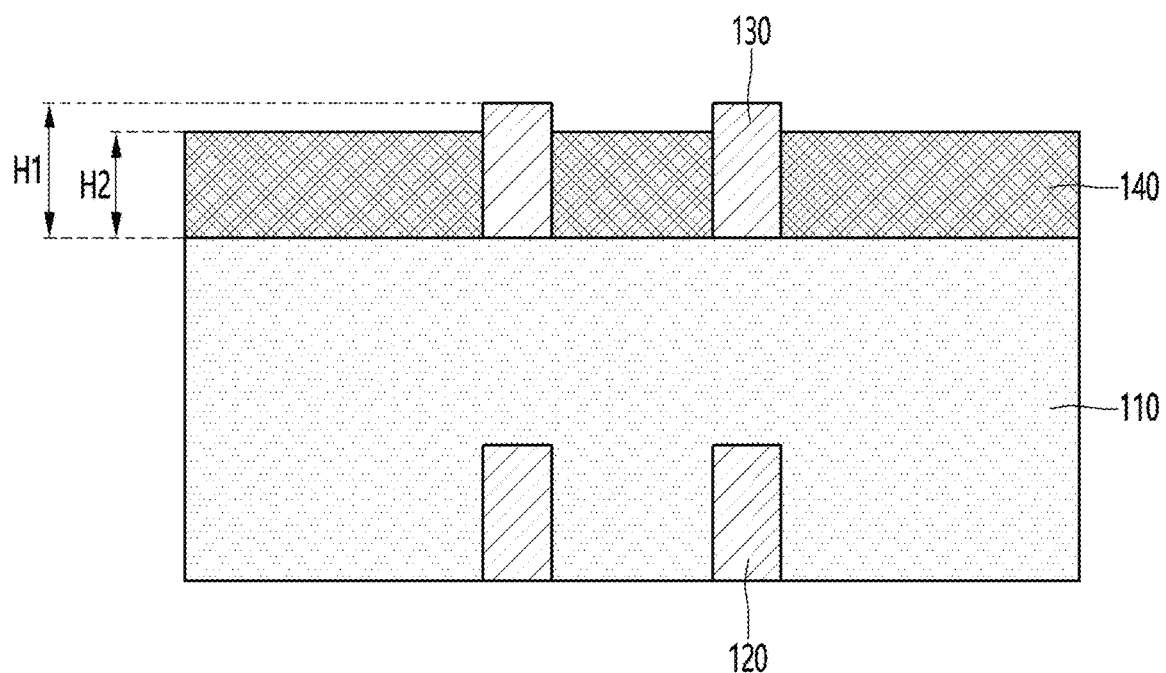
FIG. 3 is an enlarged view of area B of FIG. 2.

FIG. 2 is a view showing a printed circuit board according to an embodiment, and FIG. 3 is an enlarged view of region B of FIG. 2.

FIGS. 2 and 3, the printed circuit board 100 includes a first insulating layer 110, a second insulating layer 140, a first circuit pattern 120, a second circuit pattern 130, and a protective layer 150.

In FIG. 2, the printed circuit board 100 has a two-layer structure based on the circuit pattern layer, this is only an example, and the number of the circuit pattern layers may be further increased.

However, the first circuit pattern 120 in FIG. 2 may be a first outermost layer disposed at the bottom among the plurality of circuit pattern layers, and the second circuit pattern 140 may be a second outermost layer disposed on the top of the plurality of circuit patterns. And, although not shown in the drawing, at least one additional internal insulating layer may be disposed between the first circuit pattern 120 and the second circuit pattern 130, and an internal circuit pattern may be disposed on a surface of the internal insulating layer.

The first insulating layer 110 is a substrate on which an electric circuit capable of changing wiring is formed, and may include all of a printed circuit board, a wiring board, and an insulating substrate made of an insulating material capable of forming circuit patterns on the surface.

For example, the first insulating layer 110 may be rigid or flexible. For example, the first insulating layer 110 may include glass or plastic. In detail, the first insulating layer 110 may include chemically strengthened/semi-tempered glass such as soda lime glass or aluminosilicate glass, or reinforced or flexible plastics such as polyimide (PI), polyethylene terephthalate (PET), propylene glycol (PPG) polycarbonate (PC), or sapphire.

In addition, the first insulating layer 110 may include a photoisotropic film. For example, the first insulating layer 110 may include Cyclic Olefin Copolymer (COC), Cyclic Olefin Polymer (COP), photoisotropic polycarbonate (PC), or photoisotropic polymethylmethacrylate (PMMA).

In addition, the first insulating layer 110 may be bent while having a partially curved surface. That is, the first insulating layer 110 may be bent while partially having a flat surface and partially having a curved surface. In detail, the first insulating layer 110 may be bent while having a curved end or a surface including a random curvature, and may be bent or curved.

In addition, the first insulating layer 110 may be a flexible substrate having flexible characteristics. In addition, the first insulating layer 110 may be a curved or bent substrate. In this case, the first insulating layer 110 represents an electrical wiring connecting circuit components based on a circuit design as a wiring diagram, and an electrical conductor may be reproduced on an insulating material. In addition, the first insulating layer 110 may form a wiring for mounting electrical components and connecting them in a circuit, and mechanically fix components other than the electrical connection function of the components.

A circuit pattern may be disposed on the surface of the first insulating layer 110.

Preferably, the first circuit pattern 120 may be disposed under the first insulating layer 110. In addition, the second circuit pattern 140 may be disposed on the first insulating layer 110.

Specifically, the first circuit pattern 120 may be buried under the first insulating layer 110.

Accordingly, a lower surface of the first circuit pattern 120 may be positioned on the same plane as the lower surface of the first insulating layer 110.

The second circuit pattern 120 may be disposed on an upper surface of the first insulating layer 110. Preferably, the second circuit pattern 130 may be disposed to have a structure that protrudes on the upper surface of the first insulating layer 110.

Accordingly, the lower surface of the second circuit pattern 130 may be disposed in direct contact with the upper surface of the first insulating layer 110.

The first circuit pattern 120 and the second circuit pattern 130 are wires that transmit electrical signals, and may be formed of a metal material having high electrical conductivity. To this end, the first circuit pattern 120 and the second circuit pattern 130 may formed of at least one metal material selected from among gold (Au), silver (Ag), platinum (Pt), titanium (Ti), tin (Sn), copper (Cu), and zinc (Zn). In addition, the first circuit pattern 120 and the second circuit pattern 130 may be formed of a paste or solder paste containing one metal material of gold (Au), silver (Ag), platinum (Pt), titanium (Ti), tin (Sn), copper (Cu), and zinc (Zn) having excellent bonding strength. Preferably, the first circuit pattern 120 and the second circuit pattern 130 may be formed of copper (Cu) having high electrical conductivity and a relatively inexpensive price.

The first circuit pattern 120 and the second circuit pattern 130 may be formed by an additive process, a subtractive process, a Modified Semi Additive Process (MSAP), and a semi-additive process (SAP), which is a typical printed circuit board manufacturing process, and detailed descriptions thereof will be omitted herein.

The second insulating layer 140 may be disposed on the first insulating layer 110. Preferably, the second insulating layer 140 may be disposed between the second circuit patterns 130 on the first insulating layer 110. That is, the second circuit patterns 130 may be disposed to be spaced apart from each other by a predetermined interval on the first insulating layer 110. In addition, the second insulating layer 140 may be disposed to cover an area of the upper surface of the first insulating layer 110 in which the second circuit pattern 130 is not disposed.

Accordingly, the second insulating layer 140 may have a structure in which the second circuit pattern 130 directly contacts.

Preferably, the side surface of the second insulating layer 140 may directly contact the side surface of the second circuit pattern 130.

That is, the second insulating layer 140 may be a supporting insulating layer that is disposed to surround the periphery of the second circuit pattern 130 and supports the second circuit pattern 130.

The second insulating layer 140 may have a structure in which a resin and a filler are mixed. That is, the second insulating layer 140 may be ABF, RCC, or an insulating layer without glass fibers.

In the embodiment, as described above, the second insulating layer 140 surrounding the periphery of the second circuit pattern 130 and in direct contact with the side surface of the second circuit pattern 130 is formed on the first insulating layer 110. In addition, it is possible to support the second circuit pattern 130 of the fine pattern by the second insulating layer 140, thereby stably protecting the second circuit pattern 130 from external impact.

At this time, when the second circuit pattern 130 is not a fine pattern, the second circuit pattern 130 may be strong against external impact, and accordingly, the second insulating layer 140 may not be necessary. However, when the second circuit pattern 130 is a fine pattern, there is a problem that it easily collapses due to an external impact, and accordingly, the second circuit pattern 130 can be stably supported using the second insulating layer 140.

Accordingly, the width of the second circuit pattern 130 may be in a range of 6 μm to 15 μm. It is difficult to form the second circuit pattern 130 to have a width of less than 6 μm, and in the case of the second circuit pattern 130 having a width of less than 6 μm, it is too vulnerable to an external impact, so there may be a problem in reliability. Also, the width of the second circuit pattern 130 may be 15 μm or less. In this case, the width of the second circuit pattern 130 may be greater than 15 μm. However, when the second circuit pattern 130 is larger than 15 μm, the need for the second insulating layer 140 is low, and even without the second insulating layer 140, the second circuit pattern 130 does not easily collapse.

In addition, a space between the second circuit patterns 130 is set to have a range of 8 μm to 15 μm.

Meanwhile, as shown in FIG. 3, a height H2 of the second insulating layer 140 may be smaller than the height H1 of the second circuit pattern 130. That is, the upper surface of the second insulating layer 140 may be positioned lower than the upper surface of the second circuit pattern 130. In addition, the lower surface of the second insulating layer 140 may be positioned on the same plane as the lower surface of the second circuit pattern 130.

Meanwhile, the height H2 of the second insulating layer 140 may be the same as the height H1 of the second circuit pattern 130. However, when the height H1 of the second circuit pattern 130 and the height H2 of the second insulating layer 140 are equal to each other, a part of the second insulating layer 140 may remain on the second circuit pattern 130, and accordingly, a problem may occur in the function of the second circuit pattern 130. Here, when the second circuit pattern 130 functions as a pad connected to a device (not shown), the functional problem may mean a reliability problem in electrical connection with the device. Accordingly, the height H2 of the second insulating layer 140 is lower than the height H1 of the second circuit pattern 130 to solve the reliability problem as described above.

Meanwhile, when the height H2 of the second insulating layer 140 is too low, the second circuit pattern 130 cannot be stably supported. Accordingly, the height H2 of the second insulating layer 140 is set to be 20% or more of the height H1 of the second circuit pattern 130. That is, when the height H2 of the second insulating layer 140 is less than 20% of the height H1 of the second circuit pattern 130, the second circuit pattern 130 cannot be stably supported by the second insulating layer 140, and accordingly, the collapse of the second circuit pattern 130 may occur.

In addition, the height H2 of the second insulating layer 140 is set to be 99% or less of the height of the second circuit pattern 130. That is, when the height H2 of the second insulating layer 140 exceeds 99% of the height H1 of the second circuit pattern 130, a part of the resin of the second insulating layer 140 may remain on the surface of the second circuit pattern 130, and thus a reliability problem may occur.

Meanwhile, in a general printed circuit board, a solder resist is disposed on the first insulating layer 110 instead of the second insulating layer 140. However, when the solder resist is disposed in a state in which the second insulating layer 140 is not disposed, a situation in which the second circuit pattern 130 collapses may occur in the process of applying the solder resist. In addition, when the solder resist is removed while the solder resist is applied over the second circuit pattern 130, due to the characteristics of the solder resist, a crack is highly likely to occur, and accordingly, a problem may occur in the reliability of the printed circuit board.

Accordingly, in an embodiment, the solder resist may be disposed after the second insulating layer 140 is preferentially disposed to stably support the second circuit pattern 130 of the fine pattern.

That is, the protective layer 150 may be disposed on the second insulating layer 140.

The protective layer 150 may be formed of at least one layer using any one or more of Solder Resist (SR), oxide, and Au. Preferably, the protective layer 150 may be a solder resist.

The protective layer 150 may be disposed on the second insulating layer 140. Preferably, a lower surface of the protective layer 150 may be disposed in direct contact with an upper surface of the second insulating layer 140. The protective layer 150 may have an opening exposing a surface of at least one of the second circuit patterns 130 disposed on the first insulating layer 110.

In addition, a lower surface of the protective layer 150 may be positioned lower than an upper surface of the second insulating layer 140. In addition, the upper surface of the protective layer 150 may be positioned higher than the upper surface of the second insulating layer 140.

Hereinafter, the printed circuit board 100 according to the presence or absence of the second insulating layer 140 and the height of the second insulating layer 140 will be described.

Figure 4A:
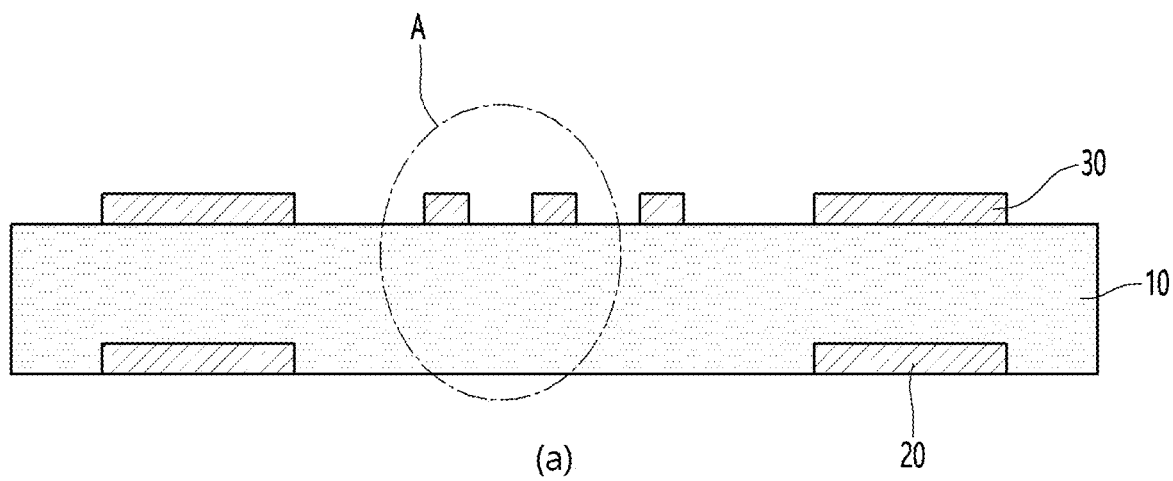
FIG. 4A is a view showing a printed circuit board according to a comparative example.
Figure 4A:
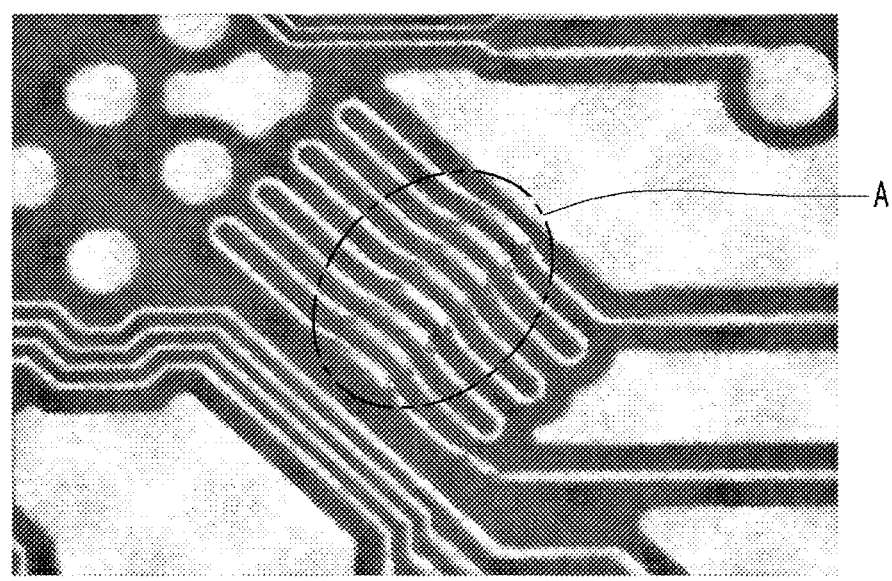
Figure 4B:
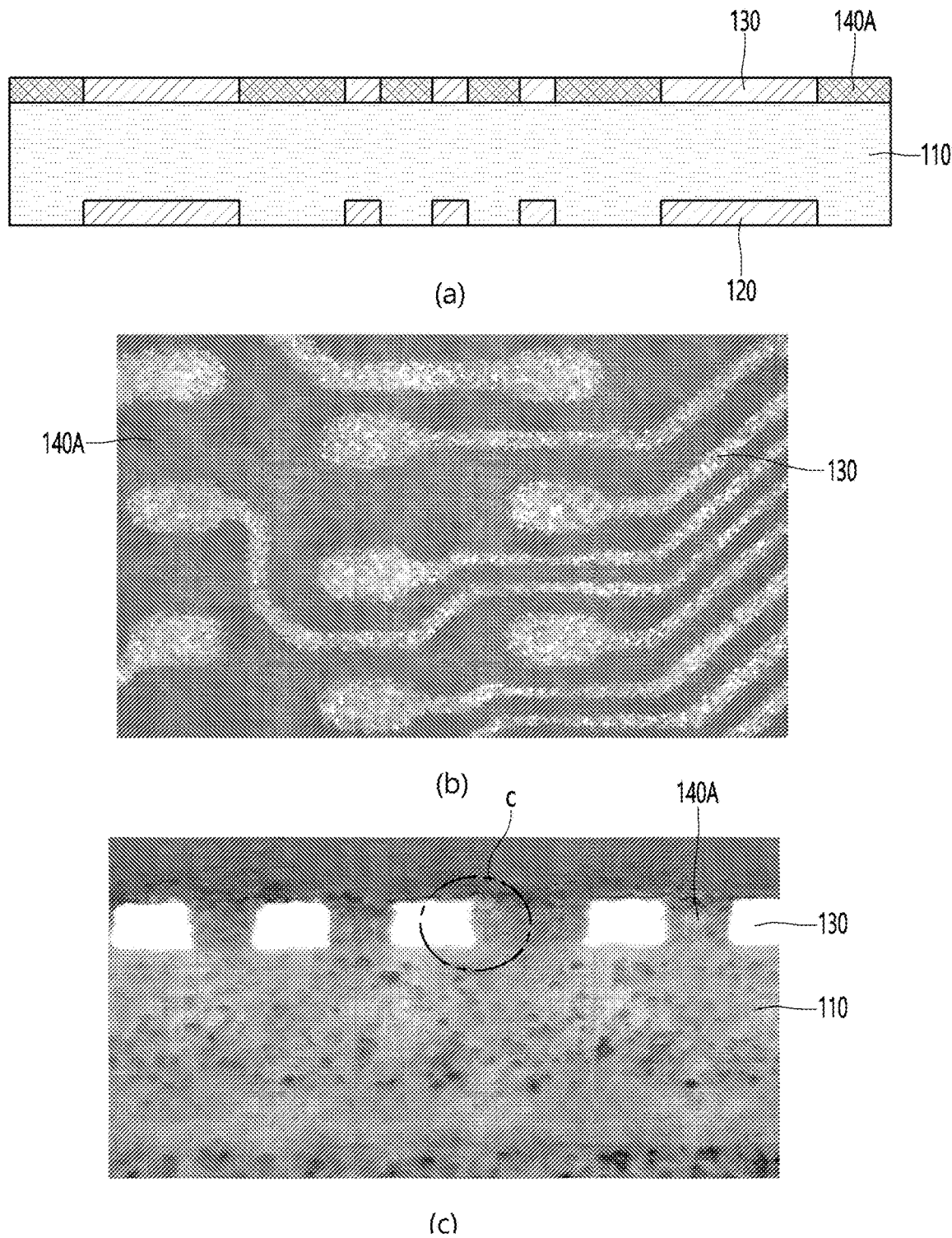
FIG. 4B is a view referenced for explanation of a problem occurring according to the height of the second insulating layer.
Figure 4C:
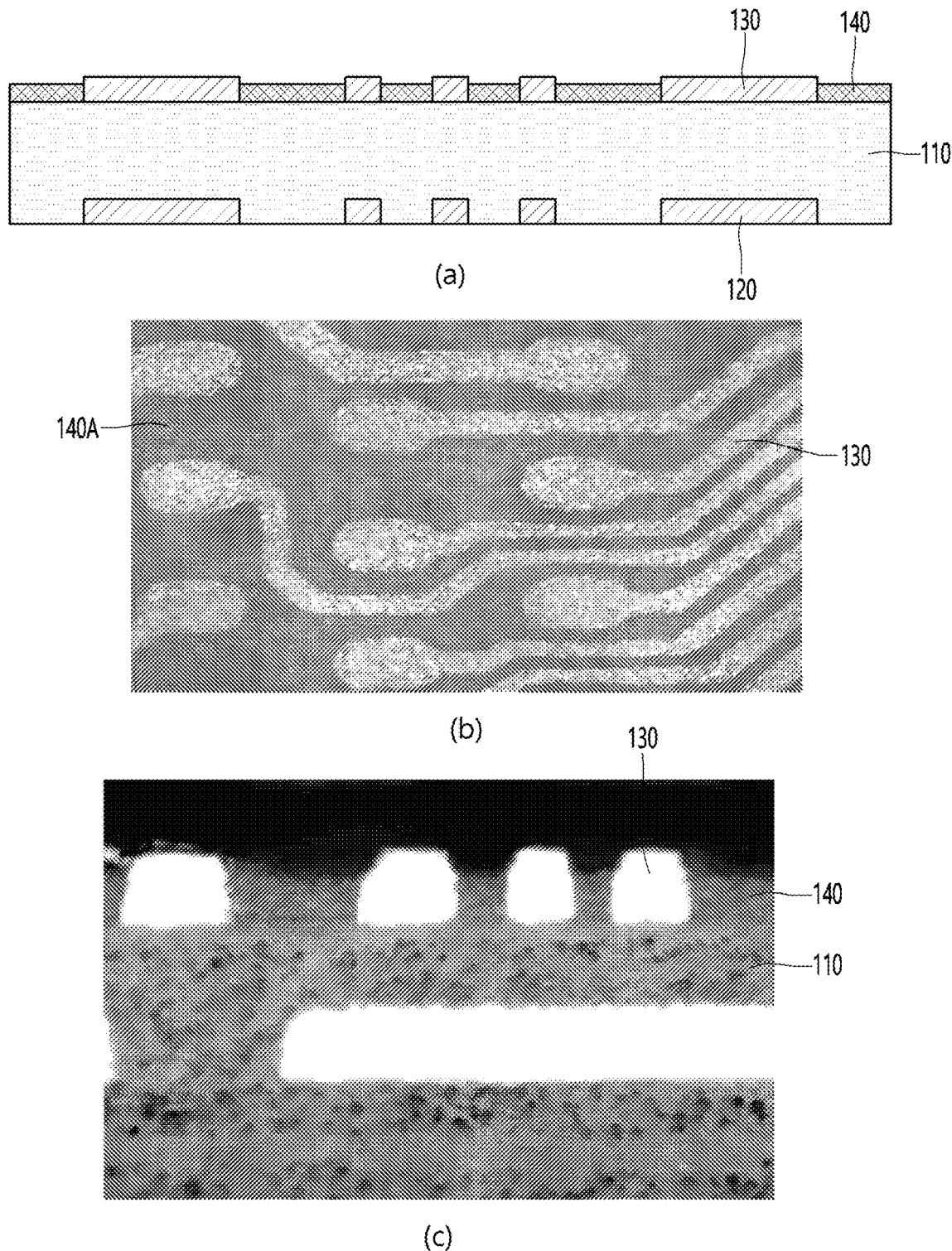
FIG. 4C is a view showing a printed circuit board according to the present embodiment.

FIG. 4a is a view showing a printed circuit board according to a comparative example, FIG. 4b is a view referenced for explanation of a problem occurring according to the height of the second insulating layer, and FIG. 4c is a view showing a printed circuit board according to the present embodiment.

According to the drawing (a) as in FIG. 4a, the second circuit pattern 30 is disposed on the insulating layer 10. In this case, the second circuit pattern 30 has a structure that protrudes on the upper surface of the insulating layer 10. In addition, a supporting insulating layer supporting the second circuit pattern 30 is not present on the insulating layer 10.

And, as shown in (b) of FIG. 4a, since the supporting insulating layer does not exist, in the second circuit pattern 30 of the comparative example, the circuit pattern in the region A corresponding to the fine pattern is collapsed or abraded.

As shown in (a) of FIG. 4b, the printed circuit board 100 may include a first insulating layer 110 and a second insulating layer 140A surrounding the second circuit pattern 130 on the first insulating layer 110. In this case, the height of the second insulating layer 140A may be the same as or greater than the height of the second circuit pattern 130.

According to this, as shown in (b) and (c) of FIG. 4b, the second insulating layer 140A may remain on the surface of a partial region (C) of the region of the second circuit pattern 130, and accordingly, a surface area of the second circuit pattern 130 exposed to the outside may be reduced. In addition, when the surface area of the second circuit pattern 130 is reduced, a mounting defect of the device may occur due to a reduction in a component mounting region for mounting the device.

On the other hand, as shown in (a), (b) and (c) of FIG. 4c, the printed circuit board 100 has a first insulating layer 110 and a second insulating layer 140 disposed on the first insulating layer 110 to surround the second circuit pattern 130. In this case, the height of the second insulating layer 140 may be smaller than the height of the second circuit pattern 130. Preferably, the height of the second insulating layer 140 may be in a range of 20% to 99% of the height of the second circuit pattern 130.

Accordingly, in the second circuit pattern disposed on the first insulating layer and protruding on the surface of the first insulating layer, a second insulating layer supporting the side of the second circuit pattern is formed on the first insulating layer. Accordingly, it is possible to solve problems such as collapsing or rubbing of the protruding second circuit pattern due to miniaturization of the second circuit pattern, and thus product reliability can be improved.

Also, in forming the second insulating layer, the upper surface of the second insulating layer is positioned lower than the upper surface of the second circuit pattern. That is, in the embodiment, the height of the second insulating layer is lower than the height of the second circuit pattern. Accordingly, it is possible to solve the problem that the exposed area of the surface of the second circuit pattern is reduced due to the second insulating layer remaining on the surface of the second circuit pattern, and thus the problem of reducing the component mounting region can be solved.

Figure 5:
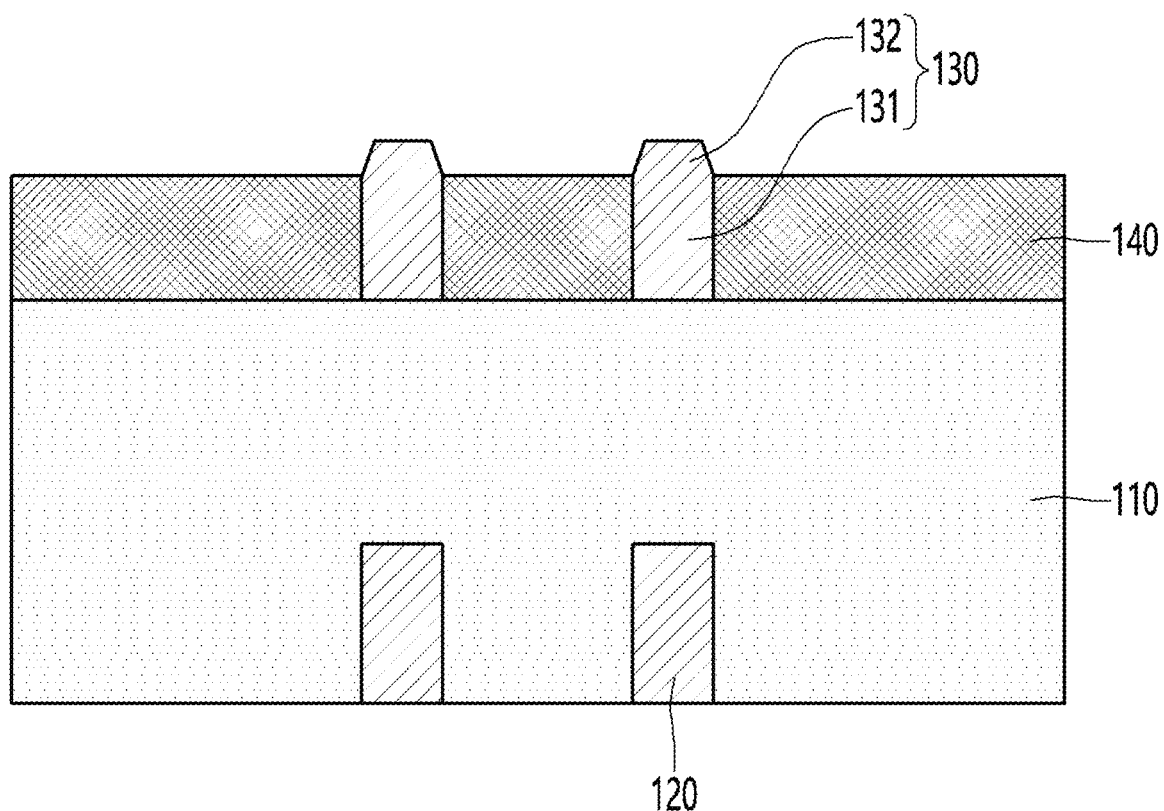
FIG. 5 is a view showing a shape change of a second circuit pattern according to an embodiment.

FIG. 5 is a view showing a shape change of a second circuit pattern according to an embodiment.

Referring to FIG. 5, the printed circuit board 100 includes a second circuit pattern 130 disposed on the first insulating layer 110.

In this case, a second insulating layer 140 disposed in a region between the second circuit patterns 130 may be included on the first insulating layer 110.

Here, the second insulating layer 140 has a height in the range of 20% to 99% of the height of the second circuit pattern 130. For example, when the height of the second insulating layer 140 is 80% of the height of the second circuit pattern 130, an upper region of 20% of the total region of the second circuit pattern 130 may be removed together during the etching process of the second insulating layer 140.

Accordingly, the second circuit pattern 130 may include a first portion 131 disposed on the first insulating layer 110 and a second portion 132 disposed on the first portion 131.

In this case, the first portion 131 is protected by the second insulating layer 140, and thus an area of the upper surface and an area of the lower surface may be the same.

On the other hand, the upper portion of the second portion 132 may be removed together in the etching process of the second insulating layer 140, and thus an area of the upper surface may be smaller than an area of the lower surface. Preferably, the cross-section of the second portion 132 may have a trapezoidal shape. For example, the side surface of the second portion 132 may be inclined with a predetermined inclination.

Figure 6A:
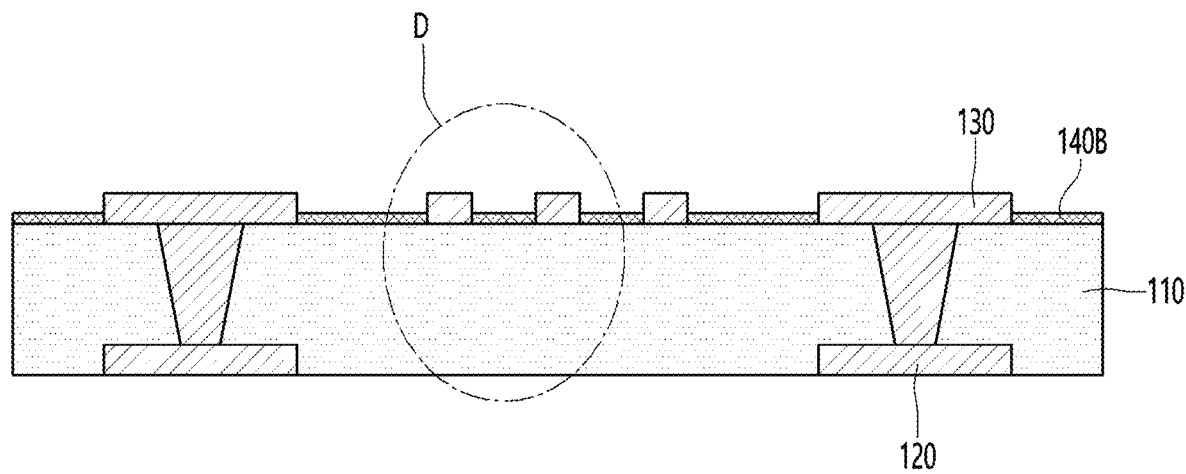
FIGS. 6A and 6B are views for explaining a problem that occurs according to the height of the second insulating layer.
Figure 6B:
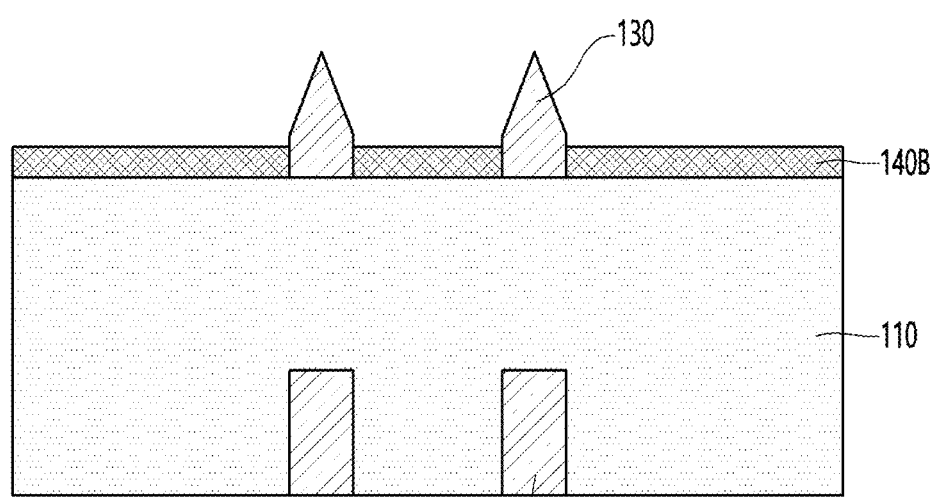

FIG. 6 is a view for explaining a problem that occurs according to the height of the second insulating layer.

As shown in FIG. 6, the printed circuit board 100 may include a first insulating layer 110 and a second insulating layer 140B disposed on the first insulating layer 110 to surround the second circuit pattern 130. In this case, the height of the second insulating layer 140B may be smaller than the height of the second circuit pattern 130. Preferably, the height of the second insulating layer 140B may be less than 20% of the height of the second circuit pattern 130.

In this case, 80% or more of the upper region of the second circuit pattern 130 may be removed together in the etching process of the second insulating layer 140. In this case, as the region to be removed of the second circuit pattern 130 increases, the uppermost region may have a triangular pyramid shape. Preferably, the upper region of the second circuit pattern 130 may have a triangular shape. Accordingly, a mounting region for mounting the device on the second circuit pattern 130 is not secured, and thus a mounting defect occurs.

Meanwhile, in the embodiment, the second insulating layer 140 may have a height of 20% to 99% compared to the height H1 of the second circuit pattern 130 as described above by the etching process.

In this case, the second insulating layer 140 may include a resin and an inorganic filler.

In addition, the inorganic filler disposed inside the second insulating layer 140 may be exposed on the surface by the etching.

Meanwhile, the etching of the second insulating layer 140 may be performed by sand blasting, or alternatively, by a plasma process.

Figure 7A:
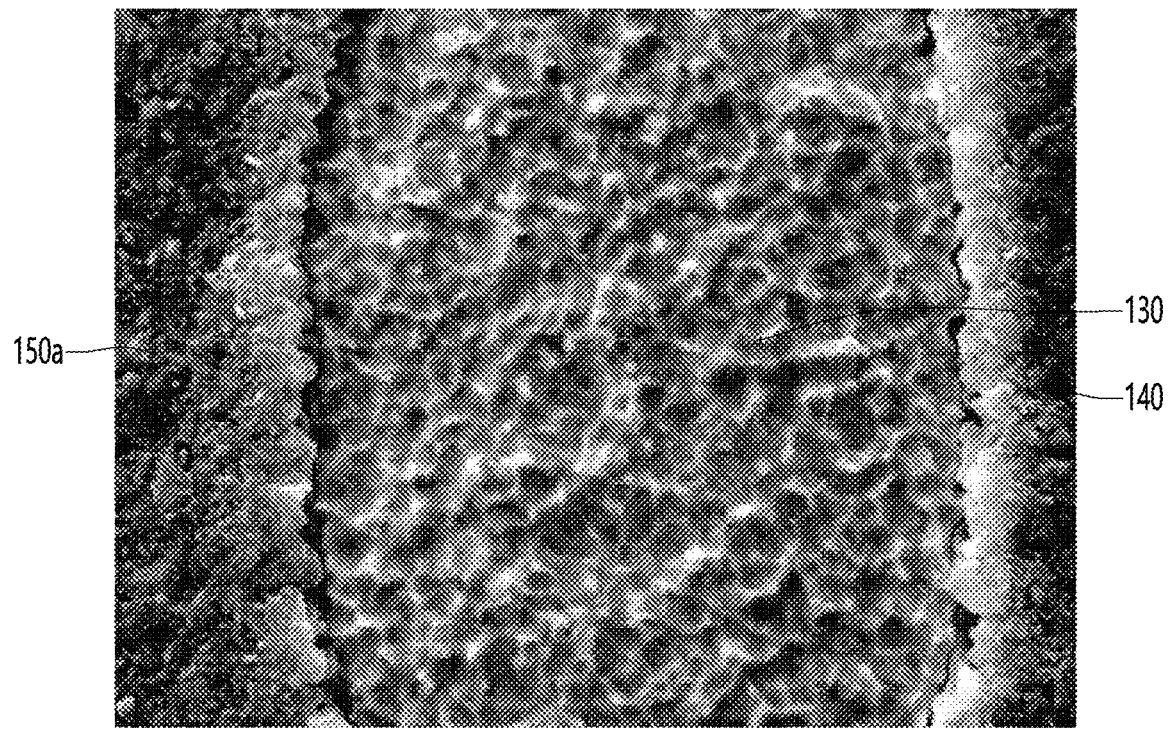
FIG. 7A is a view showing a surface of a printed circuit board formed by sand blasting.
Figure 7A:
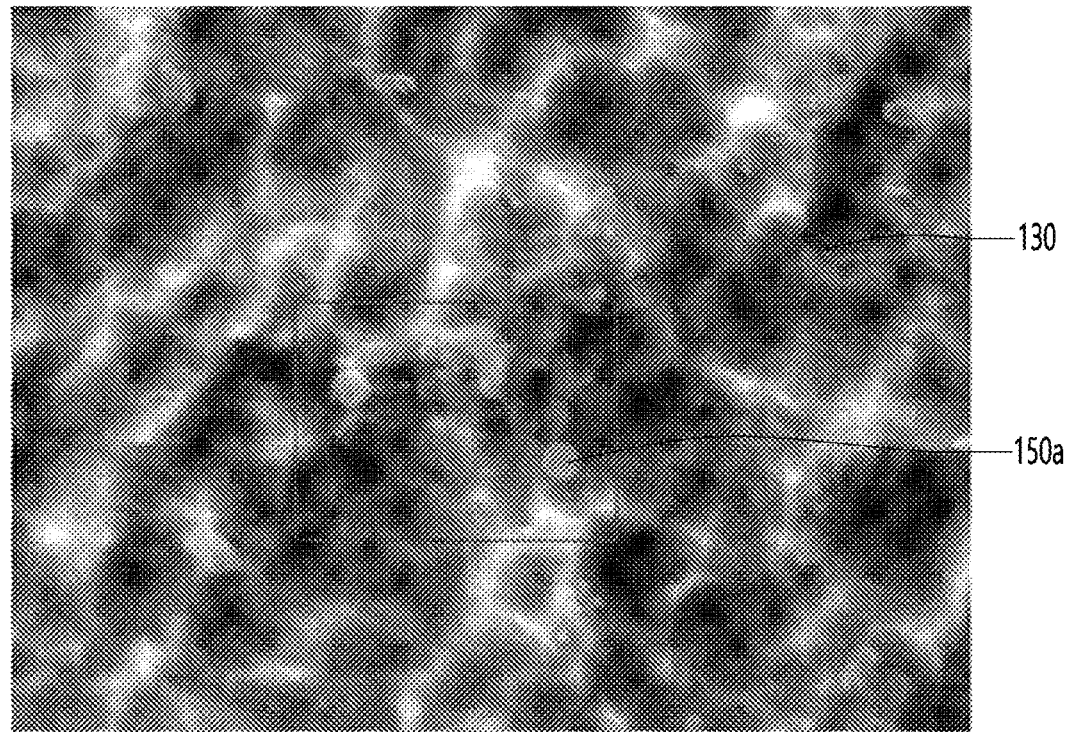
Figure 7B:
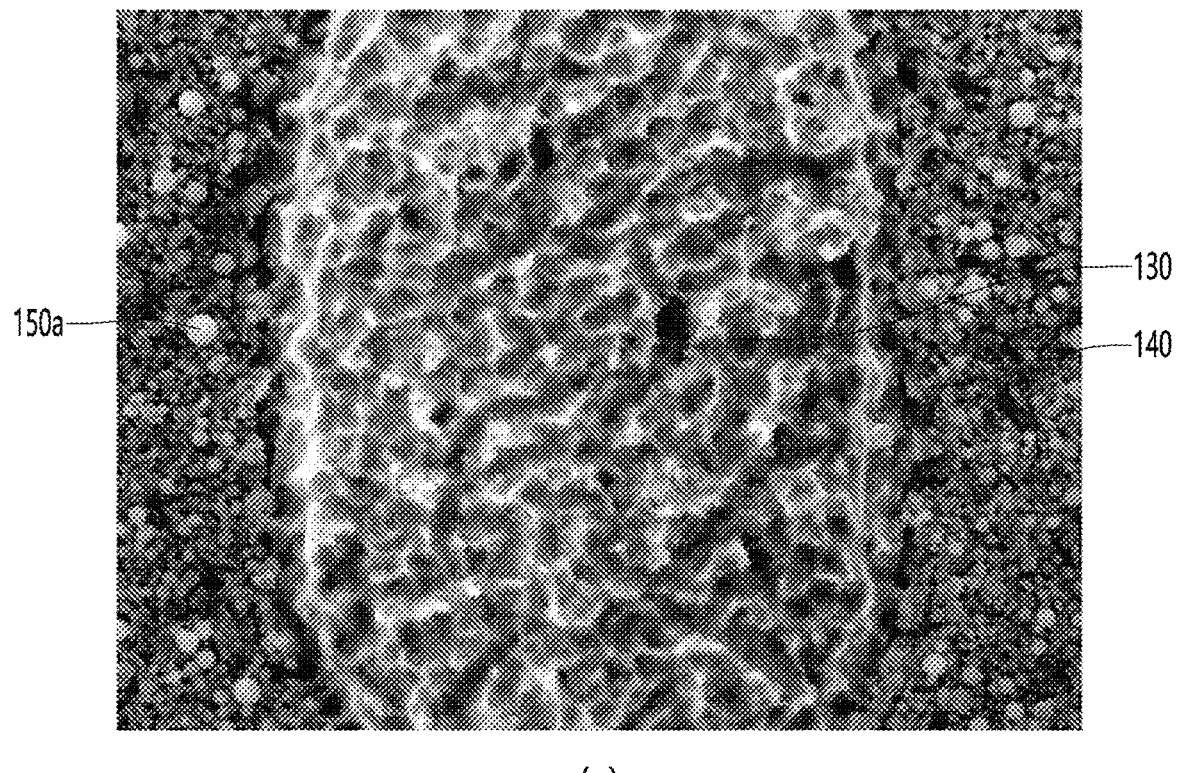
FIG. 7B is a view showing a surface of a printed circuit board formed by plasma.
Figure 7B:
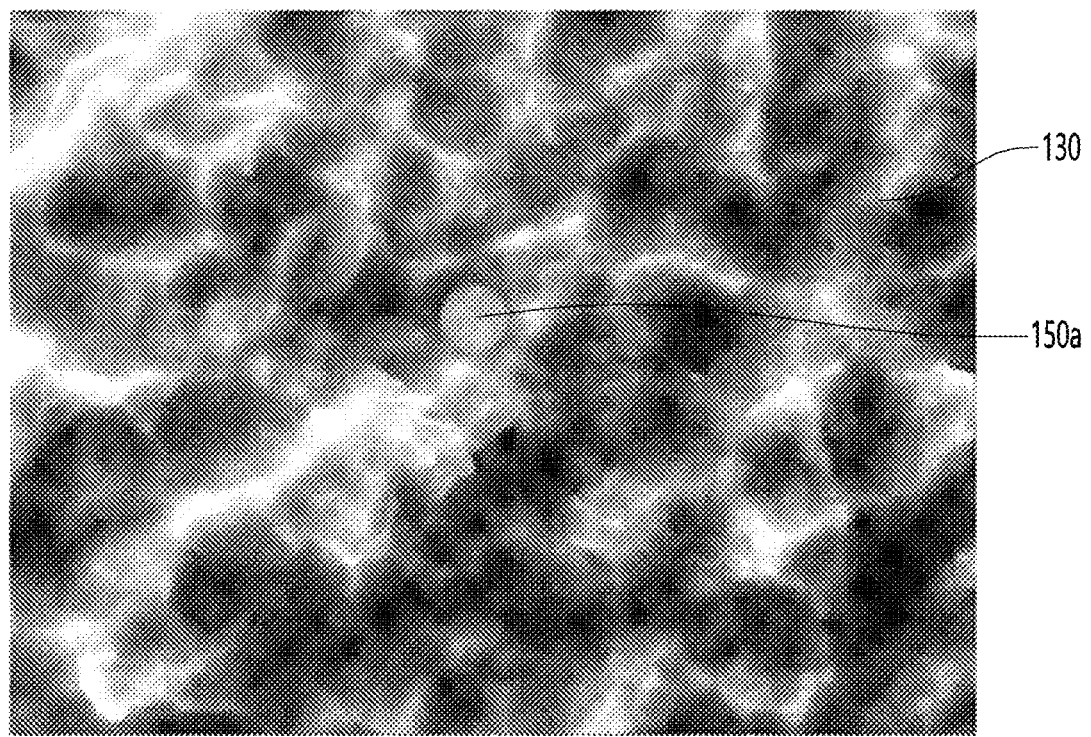

FIG. 7a is a view showing a surface of a printed circuit board formed by sand blasting. FIG. 7b is a view showing a surface of a printed circuit board formed by plasma.

FIG. (a) of 7a is an SEM photograph of surfaces of the second insulating layer 140 and the second circuit pattern 130 magnified by 3000 times. And, (b) of 7a is an SEM photograph of the surfaces of the second circuit pattern 130 magnified by 10000 times.

As shown in (a) of FIG. 7a, an inorganic filler 150a may be disposed in the second insulating layer 140, as the sand blasting process of the second insulating layer 140 proceeds, the inorganic filler 150a may be exposed on the surface.

Also, as shown in (b) of FIG. 7a, it may be confirmed that the inorganic filler 150a included in the second insulating layer 140 remains on the surface of the second circuit pattern 130.

At this time, the results of surface analysis of the second circuit pattern are shown in Table 1.

TABLE 1

| element | concentration | unit |
| --- | --- | --- |
| O | 1.591 | wt. % |
| Si | 0.522 | wt. % |
| Cu | 97.887 | wt. % |
| Sum total | 100 | wt. % |

As shown in Table 1, it was confirmed that 1.591 wt. % of O element was present on the surface of the second circuit pattern 130, it was confirmed that 0.522 wt. % of Si element was present, and it was confirmed that 97.887 wt. % of Cu element, which is a raw material of the second circuit pattern 130 was present.

(a) of FIG. 7b is an SEM image magnifying 3000 times the surfaces of the second insulating layer 140 and the second circuit pattern 130 formed by the plasma process. And, (b) of 7b is an SEM photograph of the surface of the second circuit pattern 130 magnified by 10000 times.

As shown in (a) of FIG. 7b, an inorganic filler 150a may be disposed in the second insulating layer 140, as the plasma process of the second insulating layer 140 proceeds, the inorganic filler 150a may be exposed on the surface.

Also, as shown in (b) of FIG. 7b, it may be confirmed that the inorganic filler 150a included in the second insulating layer 140 remains on the surface of the second circuit pattern 130.

At this time, the results of the surface analysis of the second circuit pattern are shown in Table 2.

TABLE 2

| element | concentration | unit |
|---------|---------------|------|
| O | 3.725 | wt. % |
| Si | 6.664 | wt. % |
| Cu | 89.611 | wt. % |
| Sum total | 100 | wt. % |

As shown in Table 1, it was confirmed that 3.725 wt. % of O element was present on the surface of the second circuit pattern 130, and it was confirmed that 6.664 wt. % of Si element was present, and it was confirmed that 89.611 wt % of Cu element, which is a raw material of the second circuit pattern 130 was present. In addition, in the embodiment, after forming the second insulating layer, the second insulating layer is etched so that an upper surface of the second insulating layer is lower than an upper surface of the second circuit pattern. In this case, the inorganic filler is present in the second insulating layer. In addition, by etching the second insulating layer, the inorganic filler may protrude from the surface of the second insulating layer in the final product. According to this, the surface area of the second insulating layer or the surface roughness of the second insulating layer can be increased by the protrusion of the inorganic filler, and accordingly, adhesion to a protective layer such as a solder resist disposed on the second insulating layer may be improved.

Figure 8A:
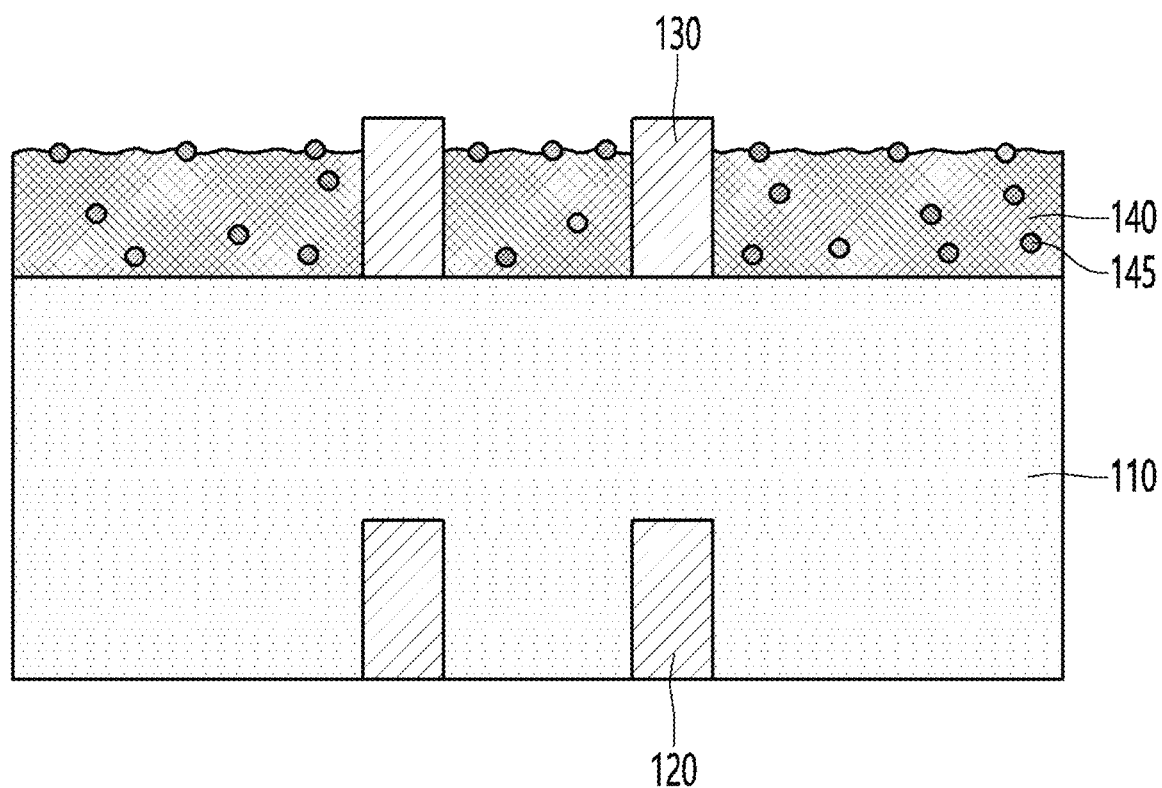
FIGS. 8A and 8B are views showing the printed circuit board shown in FIG. 2 in more detail.
Figure 8B:
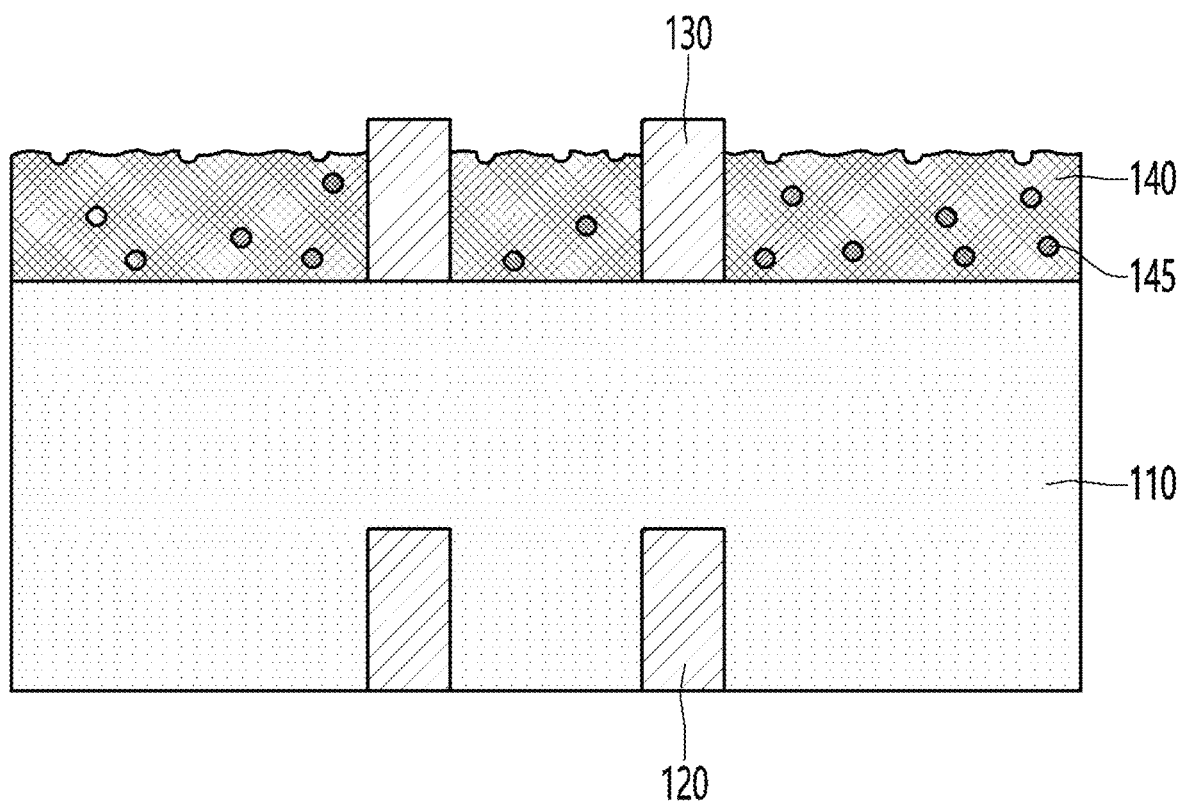

FIGS. 8A and 8B are views showing the printed circuit board shown in FIG. 2 in more detail.

FIG. 8A is a view showing the surface of the second insulating layer 140 before removal of the inorganic filler according to the embodiment, and FIG. 8B is a view showing the surface of the second insulating layer 140 after removing the inorganic filler according to the embodiment.

Referring to FIG. 8A, the second insulating layer 140 in the embodiment has a height of 20% to 99% compared to the height H1 of the second circuit pattern 130 as described above by the etching process.

In this case, the second insulating layer 140 may include a resin and an inorganic filler.

In addition, the inorganic filler disposed inside the second insulating layer 140 may be exposed on the surface by the etching.

Specifically, as shown in FIG. 8A, the second insulating layer 140 has a lower height than the second circuit pattern 130 through an etching process while covering the second circuit pattern 130. In this case, the second insulating layer 140 includes an inorganic filler disposed in the resin, and the inorganic filler 145 may be exposed on the surface of the second insulating layer 140 through the etching process. In addition, the etching process may be performed through a sand blasting process, and the surface of the second insulating layer 140 may have a curvature. That is, the surface of the second insulating layer 140 may not be flat, but may have a curvature.

In this case, as described above, the inorganic filler 145 may function to improve the bonding strength between the protective layer 150 and the protective layer 150 by providing roughness to the surface of the second insulating layer 140.

However, the inorganic filler 145 may cause a short circuit defect of the second circuit pattern 130. For example, the inorganic filler 145 remains on the upper surface of the second circuit pattern 130 as well as the surface of the second insulating layer 140. Also, as the inorganic filler 145 remains on the second circuit pattern 130, an electrical failure such as an open short may occur.

Accordingly, in the embodiment, the occurrence of electrical defects such as the open short is prevented through the process of removing the inorganic filler 145.

Referring to FIG. 8B, a recess is formed on the surface of the second insulating layer 140. The recess may be formed by removing the inorganic filler 145 exposed through the surface of the second insulating layer 140. That is, the recess may be a region in which the inorganic filler 145 is disposed. Accordingly, the recess may have the same diameter as the diameter of the inorganic filler 145.

That is, the inorganic filler 145 may be a Si filler.

Accordingly, the inorganic filler 145 may be removed using a fluorinated gas such as (NH4) HF2. A reaction formula in the case of using (NH4) HF2 as a removal gas in the removal process for the removal of the inorganic filler 145 is as follows.

$$SiO2+4NH4HF2 \rightarrow SiF4+4NH4F+2H2O \quad \text{(reaction formula)}$$

According to the reaction formula, the inorganic filler 145 remaining on the surface of the second insulating layer 140 and the surface of the second circuit pattern 130 can be efficiently removed using the (NH4) HF2.

In this case, the inorganic filler 145 may be removed through a process such as dipping or spraying.

Figure 9:
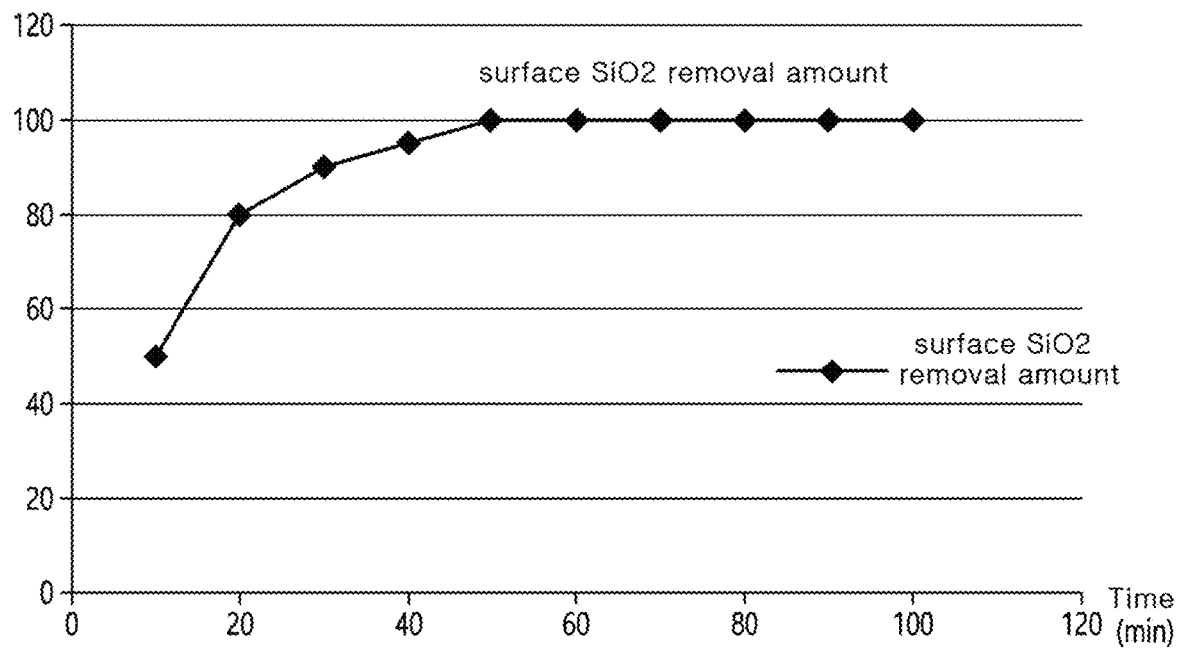
FIG. 9 is a view showing the amount of inorganic filler removed according to a process time according to the embodiment.
Figure 10:
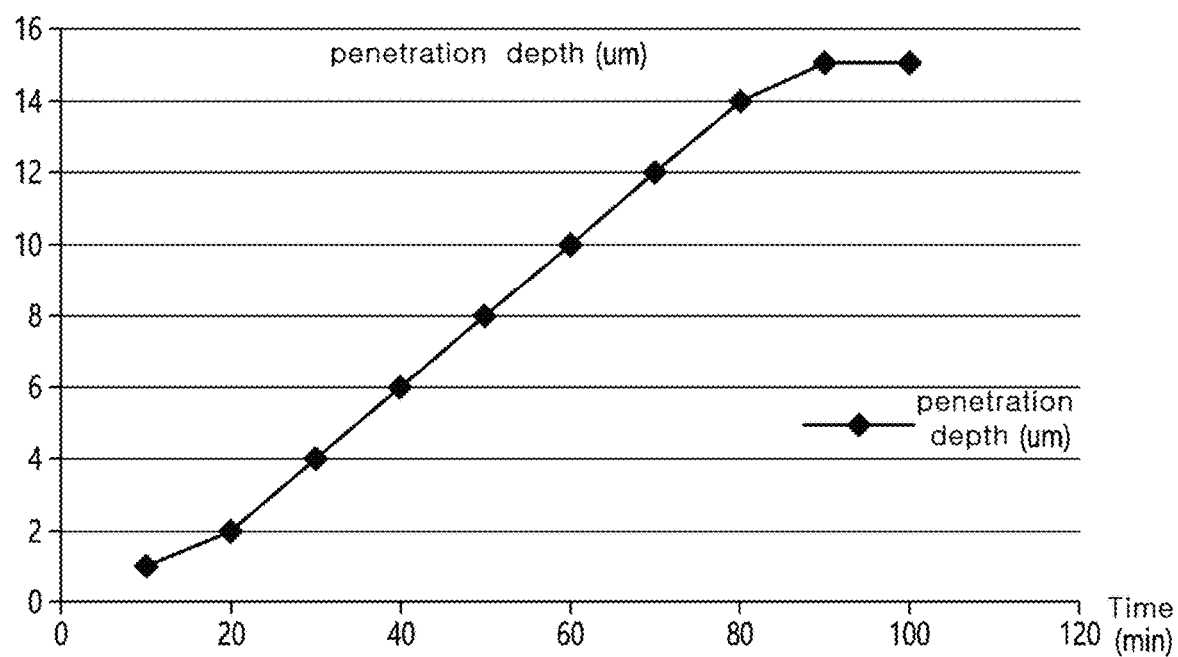
FIG. 10 is a view showing a penetration depth of a reaction gas over time according to the embodiment.
Figure 11:
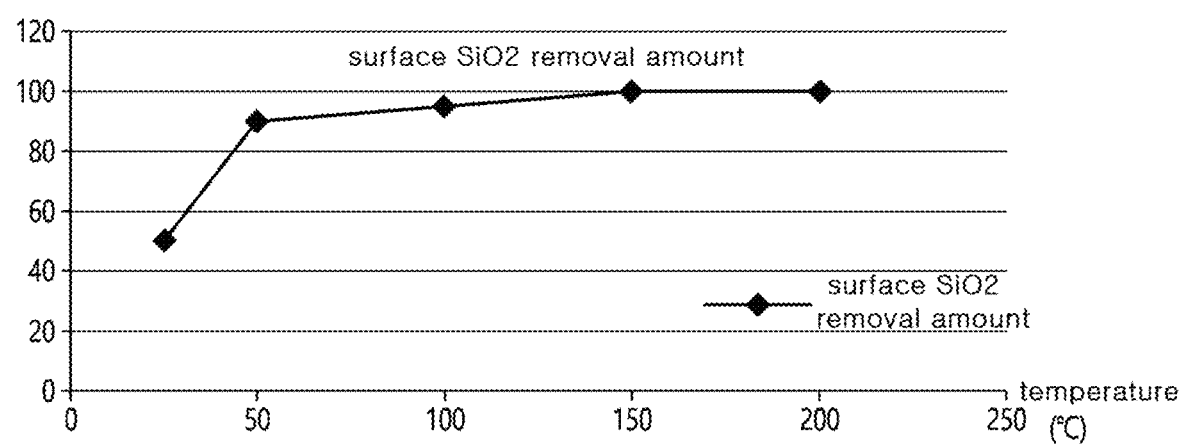
FIG. 11 is a view showing the amount of inorganic filler removed according to a process temperature according to the embodiment.

FIG. 9 is a view showing the amount of inorganic filler removed according to a process time according to the embodiment, FIG. 10 is a view showing a penetration depth of a reaction gas over time according to the embodiment, and FIG. 11 is a view showing the amount of inorganic filler removed according to a process temperature according to the embodiment.

Referring to FIGS. 9 and 10, it can be seen that when the reaction gas reacts for a long time, the depth of the reaction increases, and thus the removal amount of the inorganic filler 145 increases. This is summarized in Table 3 below.

TABLE 3

| Time(min) | Surface SiO2 Removal Amount | penetration depth |
|-----------|-----------------------------|-------------------|
| 10 | 50% | 1 μm |
| 20 | 80% | 2 μm |
| 30 | 90% | 4 μm |
| 40 | 95% | 6 μm |
| 50 | 100% | 8 μm |
| 60 | 100% | 10 μm |

TABLE 3-continued

| Time(min) | Surface SiO2 Removal Amount | penetration depth |
|---|---|---|
| 70 | 100% | 12 μm |
| 80 | 100% | 15 μm |
| 90 | 100% | 15 μm |
| 100 | 100% | 15 μm |

As described above, when the removal process is performed for 50 minutes or more, it is confirmed that 100% of the inorganic filler 145 remaining on the surface of the second insulating layer 140 and the surface of the second circuit pattern 130 is removed.

However, as the removal process time increases, the penetration depth of the reaction gas around the surface of the second insulating layer 140 increases.

In addition, as shown in FIG. 11, it is confirmed that the removal amount of the inorganic filler 145 present on the surfaces of the second insulating layer 140 and the second circuit pattern 130 increases as the process temperature increases. That is, FIG. 11 shows the removal amount of the inorganic filler 145 that changes according to the process temperature in a state where the process time is fixed (eg, 10 minutes).

According to FIGS. 9 to 11, it could be confirmed that the reaction was accelerated as the process temperature increased, and as the reaction time increased, the depth of the reaction became deeper and the amount of filler removed was increased. However, if the reaction depth is increased, damage may occur to the surface of the second insulating layer 140 or the second circuit pattern 130, and so that the process temperature, process time, etc. are adjusted so that the reaction gas can penetrate by ½ or less based on the thickness of the second insulating layer 140.

Figure 12A:
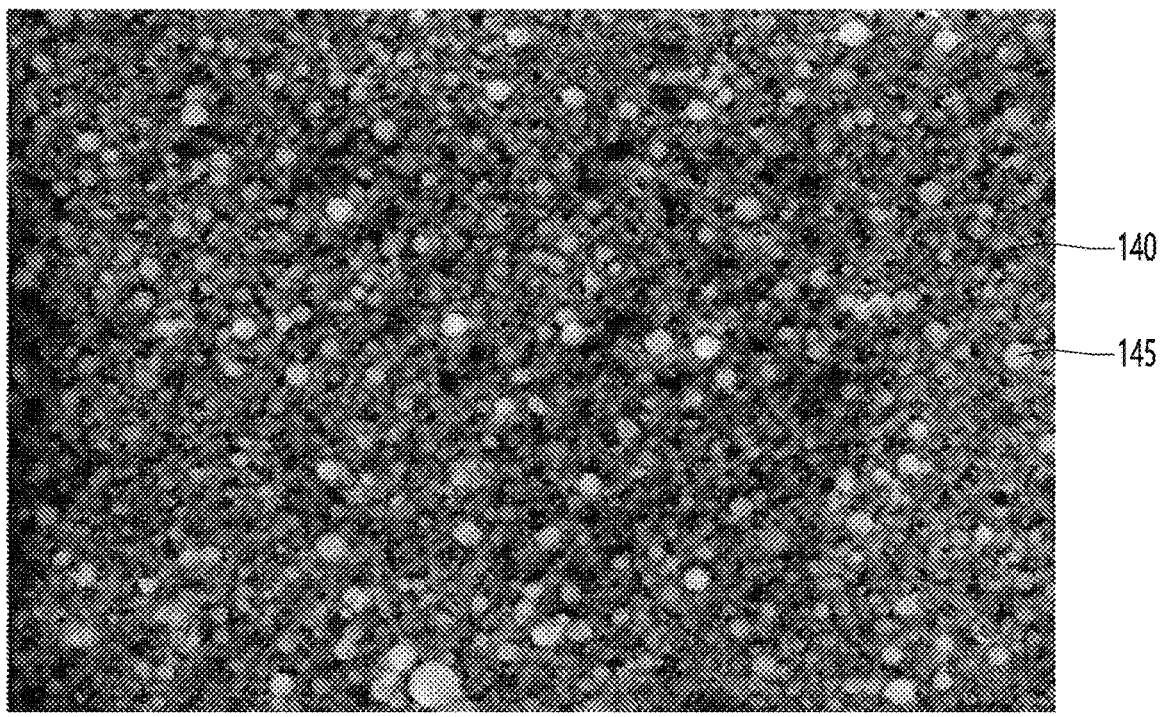
FIG. 12A is a view showing the surface change of the second insulating layer before and after the removal of the inorganic filler.
Figure 12A:
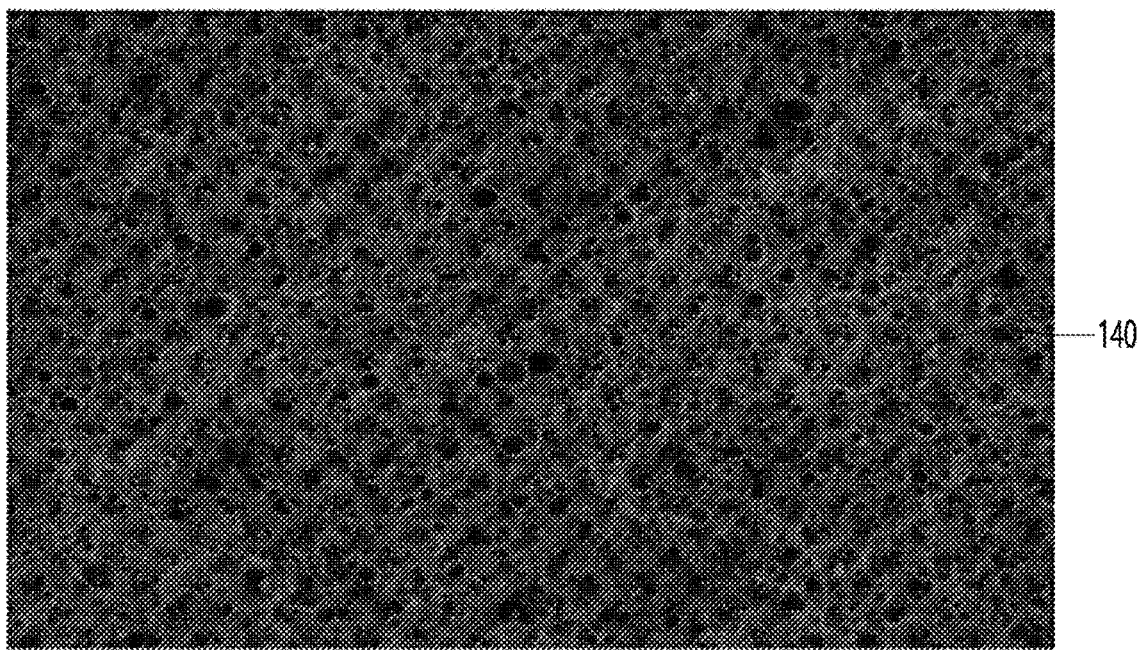
Figure 12B:
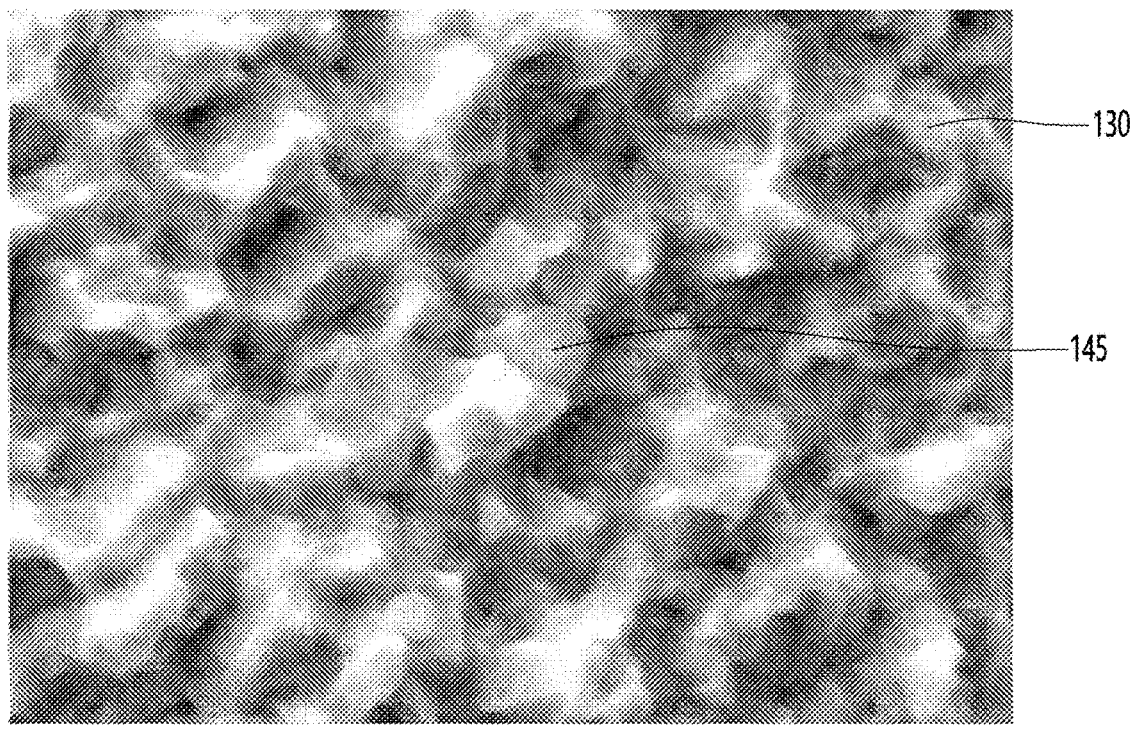
FIG. 12B shows the surface change of the second circuit pattern before and after the removal of the inorganic filler.
Figure 12B:
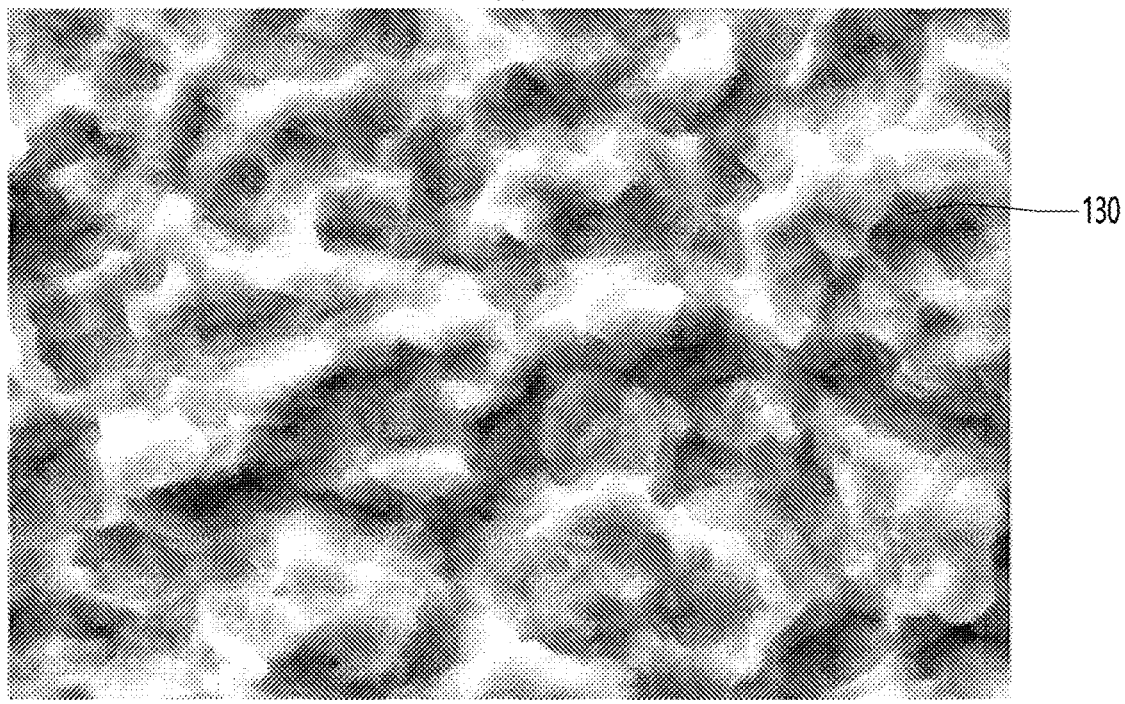

FIG. 12A is a view showing the surface change of the second insulating layer before and after the removal of the inorganic filler, and FIG. 12B shows the surface change of the second circuit pattern before and after the removal of the inorganic filler.

Referring to (a) of FIG. 12A, an inorganic filler 145 may be disposed in the second insulating layer 140, and accordingly, as a sand blast process or a plasma process is performed, the inorganic filler 145 may be exposed on the surface of the second insulating layer 140.

And, referring to FIG. 12A (b), looking at the surface of the second insulating layer 140 after the inorganic filler 145 removal process, the inorganic filler 145 as in FIG. 12A (a) is formed, it could be confirmed that all of the inorganic fillers 145 as in (a) of FIG. 12A were removed, and accordingly, it was confirmed that a recess was formed on the surface of the second insulating layer 140.

In addition, referring to (a) of FIG. 12B, it was confirmed that the inorganic filler 145 remained on the surface of the second circuit pattern 130 as the sand blasting process or the plasma process was performed.

And, referring to FIG. 12B (b), looking at the surface of the second circuit pattern 130 after the process of removing the inorganic filler 145, all of the inorganic filler 145 as in FIG. 12B (a) were removed.

Hereinafter, a method of manufacturing a printed circuit board according to the embodiment shown in FIG. 2 will be described.

FIGS. 13 to 17 are views for explaining a method of manufacturing a printed circuit board according to an embodiment in the order of processes.

Figure 13:
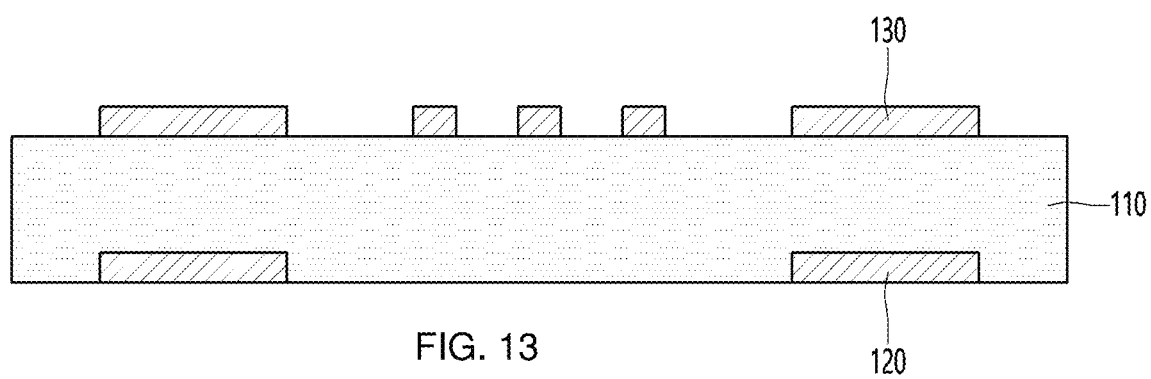
FIGS. 13 to 17 are views for explaining a method of manufacturing a printed circuit board according to an embodiment in the order of processes.

Referring to FIG. 13, first, the first insulating layer 110, a first circuit pattern 120 buried in the lower region of the first insulating layer 110, and a second circuit pattern 130 protruding on the first insulating layer 110 are formed.

In this case, the first circuit pattern 120 and the second circuit pattern 130 may be formed by an ETS method.

To this end, the manufacturing process of the printed circuit board may start from preparing a separation carrier (not shown).

When the separation carrier is prepared, the first circuit pattern 120 may be formed on the separation carrier. The first circuit pattern 120 may be formed by an additive process, a subtractive process, a Modified Semi Additive Process (MSAP), and a semi-additive process (SAP), which is a typical printed circuit board manufacturing process, and detailed descriptions thereof will be omitted herein.

In addition, the first circuit pattern 120 is a wire that transmit electrical signals, and may be formed of a metal material having high electrical conductivity. To this end, the first circuit pattern 120 may formed of at least one metal material selected from among gold (Au), silver (Ag), platinum (Pt), titanium (Ti), tin (Sn), copper (Cu), and zinc (Zn). In addition, the first circuit pattern 120 may be formed of a paste or solder paste containing one metal material of gold (Au), silver (Ag), platinum (Pt), titanium (Ti), tin (Sn), copper (Cu), and zinc (Zn) having excellent bonding strength. Preferably, the first circuit pattern may be formed of copper (Cu) having high electrical conductivity and a relatively inexpensive price.

When the first circuit pattern 120 is formed, a first insulating layer 110 covering the first circuit pattern 120 is formed on the separation carrier. Accordingly, the first circuit pattern 120 may have a structure buried in a lower region of the first insulating layer 110.

In addition, when the first circuit pattern 120 is formed, the second circuit pattern 130 may be formed on the first insulating layer 110.

Figure 14:
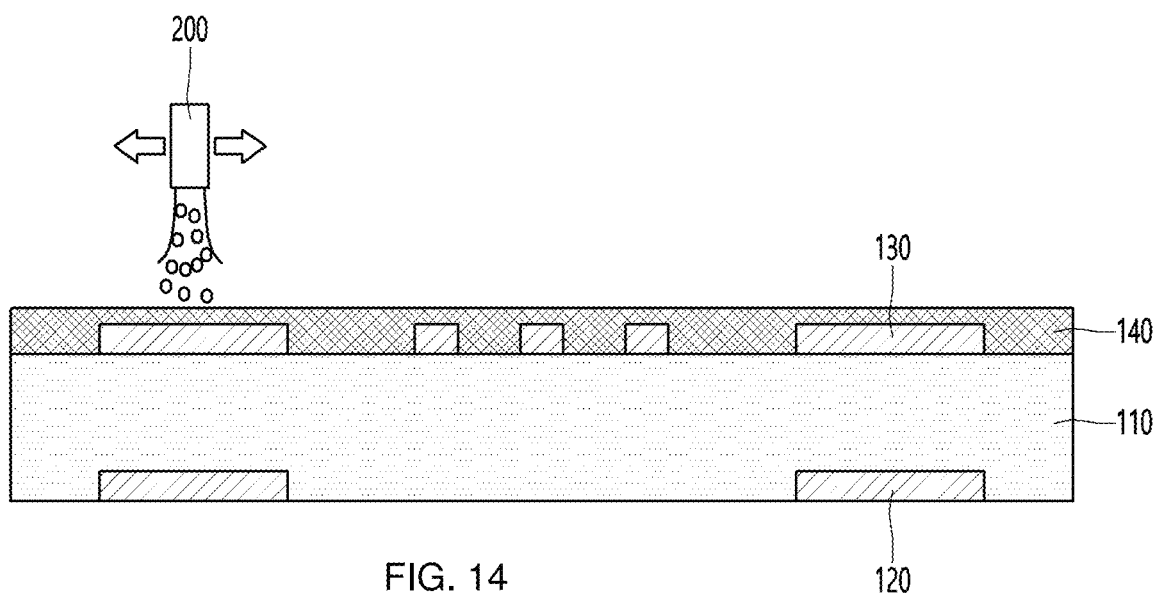

Next, as shown in FIG. 14, a second insulating layer 140 is formed on the first insulating layer 110. The second insulating layer 140 may be disposed to cover the second circuit pattern 130. Preferably, the second insulating layer 140 has a height greater than that of the second circuit pattern 130 and may be disposed on the first insulating layer 110.

Thereafter, a sand blast process or a plasma process is performed to etch the second insulating layer 140.

Figure 15:
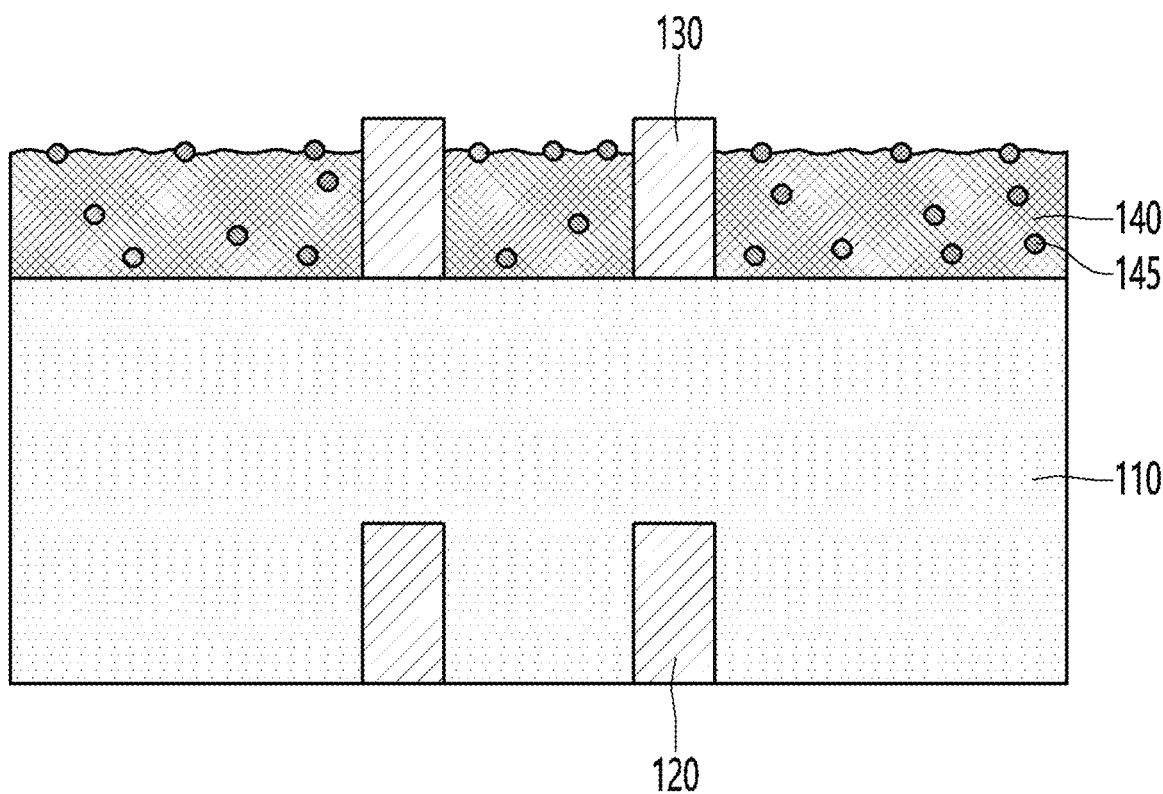

At this time, as shown in FIG. 15, by adjusting conditions of the etching process, a height H2 of the second insulating layer 140 may be 20% to 99% of a height H1 of the second circuit pattern 130.

That is, when the height H2 of the second insulating layer 140 is less than 20% of the height H1 of the second circuit pattern 130, the second circuit pattern 130 cannot be stably supported by the second insulating layer 140, and accordingly, the collapse of the second circuit pattern 130 may occur.

In addition, the height H2 of the second insulating layer 140 is set to be 99% or less of the height of the second circuit pattern 130. That is, when the height H2 of the second insulating layer 140 exceeds 99% of the height H1 of the second circuit pattern 130, a part of the resin of the second insulating layer 140 may remain on the surface of the second circuit pattern 130, and accordingly, a reliability problem may occur.

In this case, the inorganic filler 145 may remain on the surface of the second insulating layer 140, and a part of the inorganic filler 145 may also remain on the surface of the second circuit pattern 130. In addition, the surface of the second insulating layer 140 may not be flat but may have a curvature.

Figure 16:
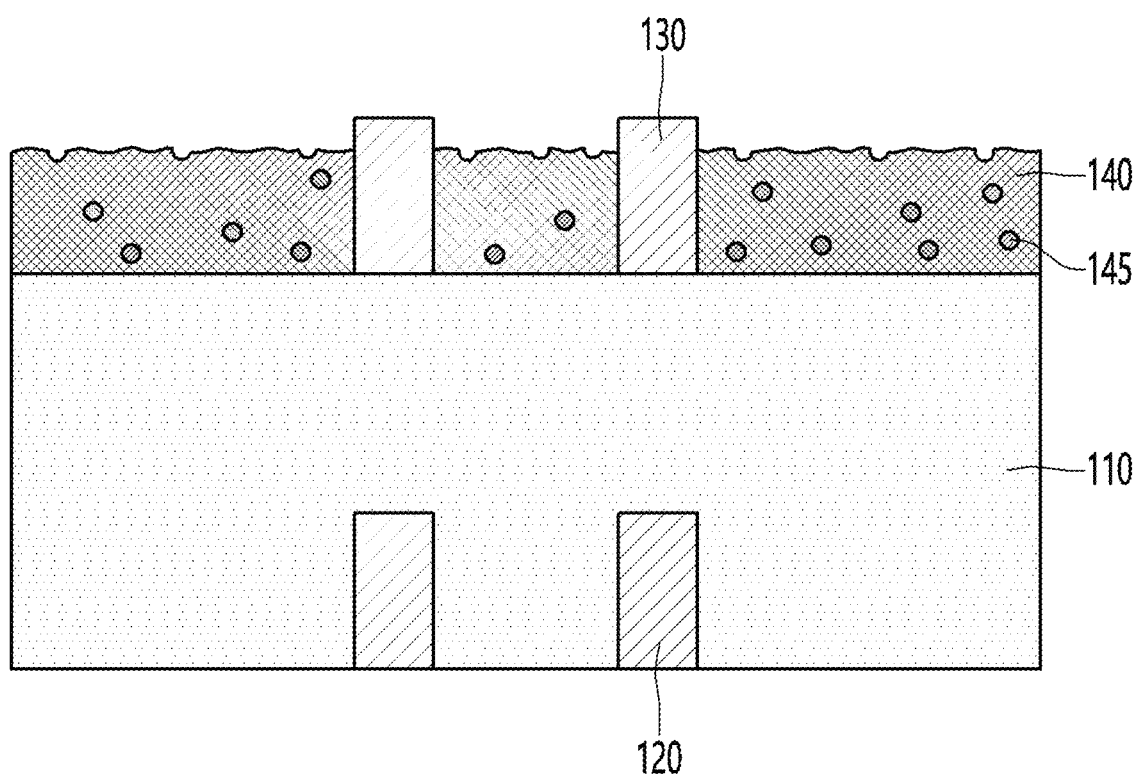

Thereafter, as shown in FIG. 16, a process of removing the inorganic filler 145 remaining on the surface of the second insulating layer 140 and the surface of the second circuit pattern 130 may be performed. Further, as the inorganic filler 145 is removed, recesses in which the inorganic filler 145 has been removed may be formed on the surface of the second insulating layer 140.

Figure 17:
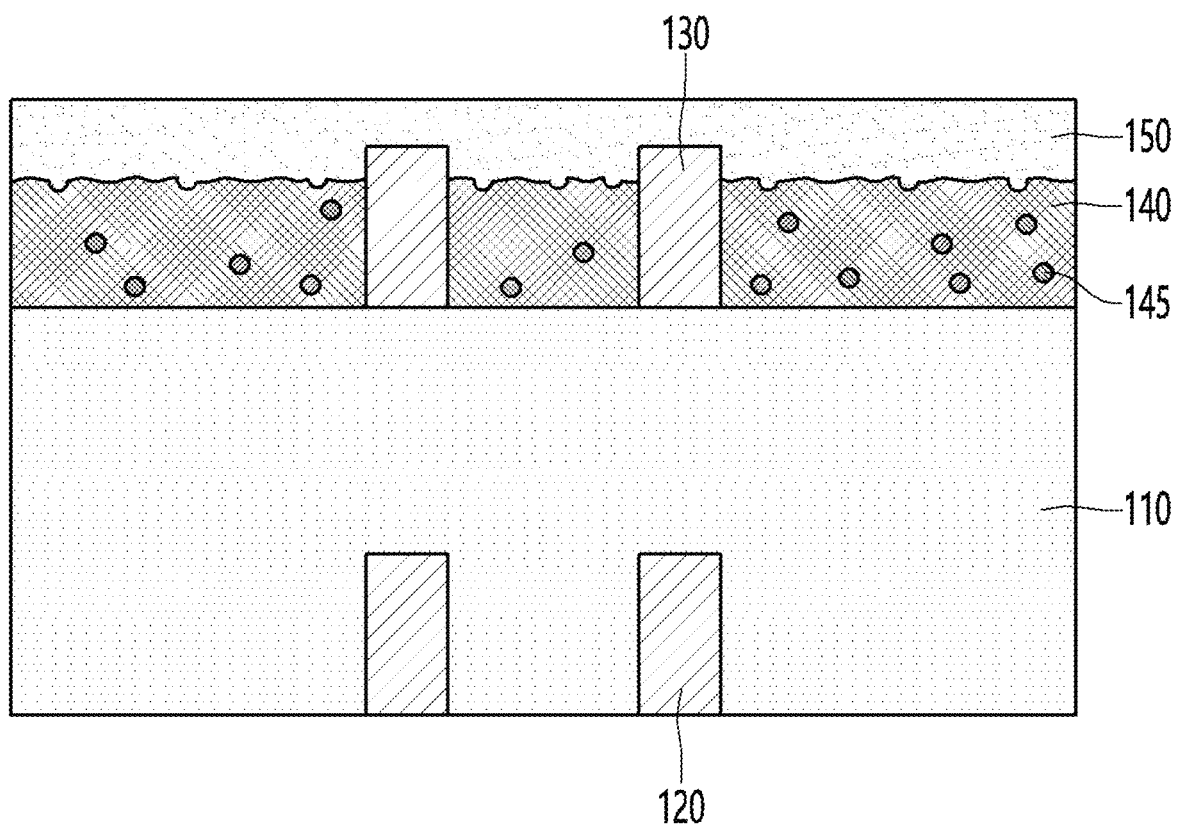

Next, as shown in FIG. 17, a protective layer 150 may be disposed on the surface of the second insulating layer 140. The protective layer 150 may be disposed to fill a recess formed in the surface of the second insulating layer 140. As described above, as the protective layer 150 is disposed to fill the recess of the second insulating layer 140, the bonding force between the protective layer 150 and the second insulating layer 140 may be further improved.

According to an embodiment according to the present invention, in the second circuit pattern disposed on the first insulating layer and protruding on a surface of the first insulating layer, a second insulating layer supporting a side of the second circuit pattern is formed on the first insulating layer. According to this, it is possible to solve problems such as collapsing or rubbing of the protruding second circuit pattern by miniaturization of the second circuit pattern, and accordingly, product reliability may be improved.

In addition, according to an embodiment of the present invention, in forming the second insulating layer, the upper surface of the second insulating layer is positioned lower than the upper surface of the second circuit pattern. That is, in the embodiment, the height of the second insulating layer is lower than the height of the second circuit pattern. Accordingly, it is possible to solve the problem that the exposed area of the surface of the second circuit pattern is reduced by the second insulating layer remaining on the surface of the second circuit pattern, and accordingly, it is possible to solve the problem of reducing the component mounting area.

Further, in the embodiment, after forming the second insulating layer, the second insulating layer is etched so that the upper surface of the second insulating layer is positioned lower than the upper surface of the second circuit pattern. In this case, the inorganic filler is present in the second insulating layer. In addition, the inorganic filler may protrude from the surface of the second insulating layer in the final product by etching the second insulating layer. According to this, the surface area of the second insulating layer or the surface roughness of the second insulating layer can be increased by the protrusion of the inorganic filler, and accordingly, adhesion to a protective layer such as a solder resist disposed on the second insulating layer may be improved.

Further, in the embodiment, after forming the second insulating layer, the second insulating layer is etched so that the upper surface of the second insulating layer is positioned lower than the upper surface of the second circuit pattern. In this case, the inorganic filler is present in the second insulating layer. In addition, the inorganic filler may protrude from the surface of the second insulating layer in the final product by etching the second insulating layer. According to this, the surface area of the second insulating layer or the surface roughness of the second insulating layer can be increased by the protrusion of the inorganic filler, and accordingly, adhesion to a protective layer such as a solder resist disposed on the second insulating layer may be improved.

In addition, in the embodiment, the inorganic filler remaining on the second insulating layer or the second circuit pattern is removed, and a protective layer is disposed on the second insulating layer from which the inorganic filler is removed. According to this, it is possible to solve the problem that a short circuit occurs between the plurality of second circuit patterns as the inorganic filler remains on the second insulating layer, and accordingly, product reliability may be improved.

In addition, the printed circuit board in the embodiment is applicable to the 5G communication system, and accordingly, it is possible to further improve reliability by minimizing transmission loss at high frequencies. Specifically, the printed circuit board in the embodiment can be used at a high frequency and can reduce propagation loss.

The invention claimed is:

1. A printed circuit board comprising: a first insulating layer; a first circuit pattern disposed on a lower surface of the first insulating layer; a second circuit pattern disposed on an upper surface of the first insulating layer; a second insulating layer disposed on the upper surface of the first insulating layer; and a protective layer disposed on an upper surface of the second insulating layer, wherein an upper surface of the second insulating layer is positioned lower than an upper surface of the second circuit pattern; wherein a lower surface of the protective layer includes: a first region in contact with the upper surface of the second insulating layer, and a second region in contact with the upper surface of the second circuit pattern; wherein at least one recess is formed on the upper surface of the second insulating layer, and where a part of the protective layer is disposed in the recess; and wherein the second insulating layer includes an inorganic filler, and wherein a width of the recess corresponds to a diameter of the inorganic filler.

2. The printed circuit board of claim 1, wherein the recess is a removal region of the inorganic filler disposed on the upper surface of the second insulating layer.

3. The printed circuit board of claim 1, wherein the width of the recess is equal to the diameter of the inorganic filler.

4. The printed circuit board of claim 1, wherein the second circuit pattern is a circuit pattern disposed on an outermost side of the printed circuit board, and wherein the second circuit pattern and the second insulating layer is disposed to protrude on the upper surface of the first insulating layer.

5. The printed circuit board of claim 4, wherein a lower surface of the second circuit pattern is positioned on the same plane as a lower surface of the second insulating layer.

6. The printed circuit board of claim 5, wherein the height of the second insulating layer is in the range of 20% to 99% of the height of the second circuit pattern.

7. The printed circuit board of claim 4, wherein the second circuit pattern includes: a first portion disposed on the upper surface of the first insulating layer and having a side surface in contact with the second insulating layer; and a second portion disposed on the first portion and protruding on the upper surface of the second insulating layer, wherein the second portion includes a region whose width changes as it goes away from the upper surface of the second insulating layer.

8. The printed circuit board of claim 7, wherein a width of the second portion decreases as the distance from the upper surface of the second insulating layer increases.

9. The printed circuit board of claim 7, wherein a width of an upper surface of the first portion corresponds to a width of a lower surface of the first portion.

10. The printed circuit board of claim 1, wherein a lower surface of the protective layer is positioned lower than the upper surface of the second circuit pattern and positioned higher than the lower surface of the second circuit pattern.

11. The printed circuit board of claim 1, wherein a width of the second circuit pattern has a range of 6 μm to 15 μm, and wherein a space between the plurality of second circuit patterns adjacent to each other is in the range of 8 μm to 15 μm.

12. The printed circuit board of claim 1, wherein the protective layer includes a solder resist.

13. A printed circuit board comprising: an insulating layer; an outermost circuit pattern disposed on an upper surface of the first insulating layer; a support layer disposed on an upper surface of the first insulating layer and having a height lower than that of the outermost circuit pattern; and a protective layer disposed on an upper surface of the support layer, wherein the support layer includes a resin and an inorganic filler disposed in the resin, wherein a recess is formed on the upper surface of the support layer to correspond to the inorganic filler, wherein the protective layer is disposed in the recess of the support layer, and wherein a lower surface of the protective layer includes: a first region in contact with the upper surface of the support layer; and a second region in contact with the upper surface of the outermost circuit pattern.

14. The printed circuit board of claim 13, wherein a width of the recess is equal to a diameter of the inorganic filler.

15. The printed circuit board of claim 13, wherein the outermost circuit pattern protrudes on the upper surface of the insulating layer, and where a lower surface of the outermost circuit pattern is positioned on the same plane as the lower surface of the support layer.

16. The printed circuit board of claim 15, wherein a height of the support layer is in the range of 20% to 99% of a height of the outermost circuit pattern.

17. The printed circuit board of claim 15, wherein the outermost circuit pattern includes: a first portion disposed on the upper surface of the insulating layer and having a side surface in contact with the support layer; and a second portion disposed on the first portion and protruding on the upper surface of the support layer, wherein a width of an upper surface of the first portion is equal to a width of a lower surface of the first portion, and wherein the second portion includes a region whose width decreases as it goes away from the upper surface of the second insulating layer.

* * * * *